(12) United States Patent
Okumura et al.

(10) Patent No.: US 8,618,666 B2
(45) Date of Patent: Dec. 31, 2013

(54) SEMICONDUCTOR DEVICE AND METHOD OF MANUFACTURING THE SAME

(75) Inventors: Mika Okumura, Chiyoda-ku (JP); Makio Horikawa, Chiyoda-ku (JP); Takeshi Murakami, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 327 days.

(21) Appl. No.: 12/791,228

(22) Filed: Jun. 1, 2010

(65) Prior Publication Data

US 2011/0042811 A1 Feb. 24, 2011

(30) Foreign Application Priority Data

Aug. 21, 2009 (JP) ................. 2009-192022

(51) Int. Cl.
*H01L 29/40* (2006.01)

(52) U.S. Cl.
USPC ......................................... 257/774; 438/667

(58) Field of Classification Search
USPC ................. 257/139, 170, 174, 621, 667, 774, 257/E23.141, E23.011, E21.585; 438/637, 438/666, 667
See application file for complete search history.

(56) References Cited

U.S. PATENT DOCUMENTS

| | | | | |
|---|---|---|---|---|
| 5,723,882 A * | 3/1998 | Okabe et al. | .................. | 257/139 |
| 5,986,348 A * | 11/1999 | Fukano | .......................... | 257/780 |
| 6,714,086 B1 * | 3/2004 | Landrith et al. | ................ | 331/56 |
| 7,253,527 B2 * | 8/2007 | Tanida et al. | ................. | 257/774 |
| 8,008,191 B2 * | 8/2011 | Kawano | ......................... | 438/637 |
| 8,373,069 B2 * | 2/2013 | Kariya et al. | ................. | 174/255 |
| 8,384,207 B2 * | 2/2013 | Toshima et al. | ............... | 257/698 |
| 8,390,124 B2 * | 3/2013 | Inoue et al. | ..................... | 257/758 |
| 2002/0011646 A1 * | 1/2002 | Liu et al. | ....................... | 257/531 |
| 2002/0190371 A1 * | 12/2002 | Mashino et al. | .............. | 257/690 |
| 2002/0190375 A1 * | 12/2002 | Mashino et al. | .............. | 257/734 |
| 2003/0011865 A1 * | 1/2003 | Kimura | ......................... | 359/237 |
| 2003/0066184 A1 | 4/2003 | Gardes et al. | | |
| 2003/0068884 A1 * | 4/2003 | Gardes | .......................... | 438/667 |
| 2003/0231093 A1 * | 12/2003 | Hsu et al. | ...................... | 336/200 |

(Continued)

FOREIGN PATENT DOCUMENTS

CN 1420716 A 5/2003
JP 2000-187041 7/2000

(Continued)

OTHER PUBLICATIONS

Burghartz et al. ("On the Design of RF spiral inductors on silicon", IEEE Trans. on Elec. Dev., vol. 50, No. 3, Mar. 2003).*

(Continued)

*Primary Examiner* — Lae Lee
*Assistant Examiner* — Grant Withers
(74) *Attorney, Agent, or Firm* — Oblon, Spivak, McClelland, Maier & Neustadt, L.L.P.

(57) ABSTRACT

A semiconductor device includes a semiconductor substrate, electrodes separated from each other and extending from a first main surface in the direction of depth of the semiconductor substrate, and an interconnect portion coupling the electrodes to each other and extending from the first main surface in the direction of depth of the semiconductor substrate without passing through the semiconductor substrate. One of the electrodes is a through electrode passing through the semiconductor substrate to reach a second main surface. For semiconductor devices having through electrodes and vertically stacked on each other, the interconnect portion serves to enhance the degree of design freedom.

10 Claims, 18 Drawing Sheets

(56) References Cited

U.S. PATENT DOCUMENTS

| | | | |
|---|---|---|---|
| 2004/0080045 A1* | 4/2004 | Kimura et al. | 257/736 |
| 2004/0106335 A1* | 6/2004 | Nemoto et al. | 439/894 |
| 2004/0161926 A1* | 8/2004 | Yamaguchi | 438/637 |
| 2004/0238857 A1* | 12/2004 | Beroz et al. | 257/232 |
| 2005/0221601 A1* | 10/2005 | Kawano | 438/622 |
| 2006/0097357 A1* | 5/2006 | Nemoto | 257/621 |
| 2007/0243706 A1* | 10/2007 | Komuro | 438/667 |
| 2007/0290300 A1* | 12/2007 | Kawakami | 257/621 |
| 2008/0157287 A1* | 7/2008 | Choi et al. | 257/621 |
| 2008/0237881 A1* | 10/2008 | Dambrauskas et al. | 257/774 |
| 2009/0032928 A1* | 2/2009 | Chiang et al. | 257/686 |
| 2009/0283871 A1* | 11/2009 | Chang et al. | 257/621 |
| 2010/0308471 A1* | 12/2010 | Korogi et al. | 257/774 |
| 2011/0163437 A1* | 7/2011 | Shin et al. | 257/698 |
| 2012/0001344 A1* | 1/2012 | Takesako et al. | 257/774 |
| 2012/0032342 A1* | 2/2012 | Min et al. | 257/774 |
| 2012/0049366 A1* | 3/2012 | Zeng | 257/738 |
| 2012/0056323 A1* | 3/2012 | Zhu | 257/751 |
| 2012/0056330 A1* | 3/2012 | Lee et al. | 257/774 |
| 2012/0068359 A1* | 3/2012 | Mori et al. | 257/774 |
| 2012/0074579 A1* | 3/2012 | Su et al. | 257/774 |
| 2012/0083119 A1* | 4/2012 | Komuro | 438/667 |
| 2012/0133048 A1* | 5/2012 | Lee et al. | 257/774 |
| 2012/0168935 A1* | 7/2012 | Huang | 257/737 |
| 2012/0187572 A1* | 7/2012 | Lin et al. | 257/774 |
| 2012/0211892 A1* | 8/2012 | Kim et al. | 257/774 |
| 2012/0211896 A1* | 8/2012 | Jeung et al. | 257/774 |
| 2013/0015588 A1* | 1/2013 | Park et al. | 257/774 |
| 2013/0161796 A1* | 6/2013 | Huang et al. | 257/621 |
| 2013/0200526 A1* | 8/2013 | Moon et al. | 257/774 |
| 2013/0207242 A1* | 8/2013 | Lee et al. | 257/621 |

FOREIGN PATENT DOCUMENTS

| | | |
|---|---|---|
| JP | 2001-44197 | 2/2001 |
| JP | 2002-237468 | 8/2002 |
| JP | 2003-46057 | 2/2003 |
| JP | 2004-152811 | 5/2004 |
| JP | 2004-200547 | 7/2004 |
| JP | 2007-96233 | 4/2007 |
| KR | 10-2003-0030957 | 4/2003 |
| KR | 10-2008-0063613 | 7/2008 |

OTHER PUBLICATIONS

Office Action issued Sep. 30, 2011, in Korean Patent Application No. 10-2010-0073756 (with English-language translation).

* cited by examiner

US 8,618,666 B2

SEMICONDUCTOR DEVICE AND METHOD OF MANUFACTURING THE SAME

BACKGROUND OF THE INVENTION

1. Field of the Invention

The present invention relates to a semiconductor device having a through electrode and a method of manufacturing the semiconductor device.

2. Description of the Background Art

Referring to FIG. 43, a semiconductor device 50 is electrically connected to semiconductor devices 60 and 70 by wire bonds 32 and 32. Semiconductor devices 60 and 70 are electrically connected to each other as well by wire bond 32.

Semiconductor device 50 is for example an integrated circuit (ASIC: Application Specific Integrated Circuit). Referring to FIG. 44, semiconductor device 50 includes a semiconductor substrate 1 having a first main surface 10 and a second main surface 20. Semiconductor device 50 also includes a semiconductor element portion 5 and a terminal 32a to be wire-bonded.

Semiconductor devices 60 and 70 are each for example a semiconductor acceleration sensor having a thin-film structure. Referring to FIG. 45, semiconductor device 60 includes a Si substrate 61. Si substrate 61 is held between cap portions 62a and 62b. In Si substrate 61, support portions 63a and 63b and floating portions 64a and 64b are formed.

Support portions 63a and 63b are connected to cap portions 62a and 62b respectively. Semiconductor device 60 includes a terminal 32b to be wire-bonded. Japanese Patent Laying-Open No. 2000-187041 discloses a configuration similar to that of semiconductor device 60.

Semiconductor device 70 is configured similarly to above-described semiconductor device 60. Semiconductor devices 50, 60 and 70 as described above are arranged on substantially the same plane (see FIG. 43), and therefore, a two-dimensional area is necessary for mounting semiconductor devices 50, 60 and 70.

In contrast, there is a technique of three-dimensionally mounting semiconductor devices 50, 60 and 70 by vertically stacking semiconductor devices 50, 60 and 70, which will now be described. Referring to FIG. 46, semiconductor devices 50, 60 and 70 are stacked in the vertical direction. Respective semiconductor elements of semiconductor devices 50, 60 and 70 are electrically connected to each other by electrodes 30a and 30c that are each a through electrode.

In FIG. 46, each semiconductor device is shown schematically for illustrative convenience, and details of the semiconductor elements are not given. Each semiconductor element is shown in detail in FIG. 47.

A detailed description will be given with reference to FIG. 47. In order to electrically connect a terminal electrode 31a which is electrically connected to a semiconductor element portion of semiconductor device 50, and a terminal electrode 31c which is electrically connected to a semiconductor element portion of semiconductor device 60, semiconductor device 60 includes electrode 30c extending therethrough in the direction of the thickness of semiconductor device 60. Electrode 30c is thus a through electrode. Between semiconductor devices 50 and 60, an electrically conductive bump 33c is provided for electrically connecting electrode 30c and terminal electrode 31a.

In order to electrically connect a terminal electrode 31e which is electrically connected to a semiconductor element portion of semiconductor device 70 and terminal electrode 31a of semiconductor device 50, semiconductor device 50 includes electrode 30a extending therethrough in the direction of the thickness of semiconductor device 50. Electrode 30a is thus a through electrode. Between semiconductor devices 50 and 70, an electrically conductive bump 33a is provided for electrically connecting electrode 30a and terminal electrode 31e. Thus, semiconductor devices 50 and 60 are electrically connected, and semiconductor devices 70 and 50 are electrically connected.

Semiconductor device 60 also includes another electrode 30d that is a through electrode for connecting respective semiconductor elements of semiconductor devices 50 and 60. Electrode 30d electrically connects a terminal electrode 31d which is electrically connected to another semiconductor element portion of semiconductor device 60, and a bump 33d provided between semiconductor devices 60 and 50.

Similarly, semiconductor device 50 includes another electrode 30b that is a through electrode for connecting respective semiconductor elements of semiconductor devices 50 and 70. Electrode 30b electrically connects a terminal electrode 31b which is electrically connected to another semiconductor element portion of semiconductor device 50, and a bump 33b provided between semiconductor devices 50 and 70.

The technique of vertically stacking semiconductor devices 50, 60 and 70 so that the semiconductor devices are three-dimensionally mounted is also disclosed in Japanese Patent Laying-Open Nos. 2004-152811, 2003-046057 and 2004-200547. A technique concerning the through electrode is also disclosed in Japanese Patent Laying-Open Nos. 2002-237468, 2001-044197 and 2007-096233.

SUMMARY OF THE INVENTION

According to the technique of three-dimensionally mounting a plurality of semiconductor devices as shown for example in FIG. 47 by means of through electrodes as described above, electrodes 30a and 30c are disposed so that they overlap in the vertical direction, in order to make an electrically adequate connection between electrodes 30a and 30c. Further, electrodes 30a and 30c are arranged so that the upper end of electrode 30a and the lower end of electrode 30c with bump 33c disposed therebetween are aligned with positional precision. Electrodes 30a and 30c are both through electrodes.

Because of the need to design each of the semiconductor devices so that through electrodes overlap in the vertical direction in the design stage, the degree of freedom in terms of arrangement of components such as semiconductor elements is restricted, resulting in an increased size of the whole semiconductor device completed as a product.

The present invention has been made in order to solve this problem, and an object of the invention is to provide a semiconductor device having a through electrode and stacked with other semiconductor devices in the vertical direction, together with an enhanced degree of design freedom, and to provide a method of manufacturing the semiconductor device.

A semiconductor device according to the present invention includes: a semiconductor substrate having first and second main surfaces; a plurality of electrodes separated from each other and extending from the first main surface in depth direction of the semiconductor substrate; an interconnect portion coupling any plurality of electrodes of the plurality of electrodes and extending from the first main surface in the depth direction of the semiconductor substrate without passing through the semiconductor substrate, for electrically connecting the plurality of electrodes to each other; and a first insulating film provided between the plurality of electrodes and the semiconductor substrate and between the interconnect portion and the semiconductor substrate.

At least one of the electrodes electrically connected by the interconnect portion is a through electrode passing through the semiconductor substrate and reaching the second main surface.

A method of manufacturing a semiconductor device according to the present invention includes the steps of: preparing a semiconductor substrate having first and second main surfaces; and forming a plurality of contact holes separated from each other and extending from the first main surface in depth direction of the semiconductor substrate, and an interconnect trench coupling any of the contact holes to each other and extending from the first main surface in the depth direction of the semiconductor substrate without passing through the semiconductor substrate.

The method further includes the steps of: forming a first insulating film covering a surface of the plurality of contact holes coupled by the interconnect trench and a surface of the interconnect trench; filling, with a conductive metal, inside of the plurality of contact holes and the interconnect trench covered with the first insulating film; and forming an electrode that is a through electrode by the conductive metal filling inside of at least one of the contact holes coupled to each other by the interconnect trench, passing through the semiconductor substrate and reaching the second main surface.

The contact hole containing the electrode is formed with a substantially circular shape as seen on the first main surface. In a portion where the interconnect trench and the contact hole containing the electrode abut on each other, a width of the interconnect trench coupled to the contact hole containing the electrode is smaller than the diameter of the contact hole containing the electrode.

The present invention can provide a semiconductor device having a through electrode and stacked with other semiconductor devices in the vertical direction, together with an enhanced degree of design freedom, as well as a method of manufacturing the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device and a method of manufacturing the semiconductor device in each embodiment according to the present invention will be described hereinafter with reference to the drawings. It should be noted that where the number, amount or the like is mentioned for each embodiment described below, the scope of the present invention is not necessarily limited to the number, amount or the like unless otherwise specified. Further, the same or corresponding components are denoted by the same reference numbers, and a description thereof will not be repeated in some cases.

First Embodiment

Figure 1:
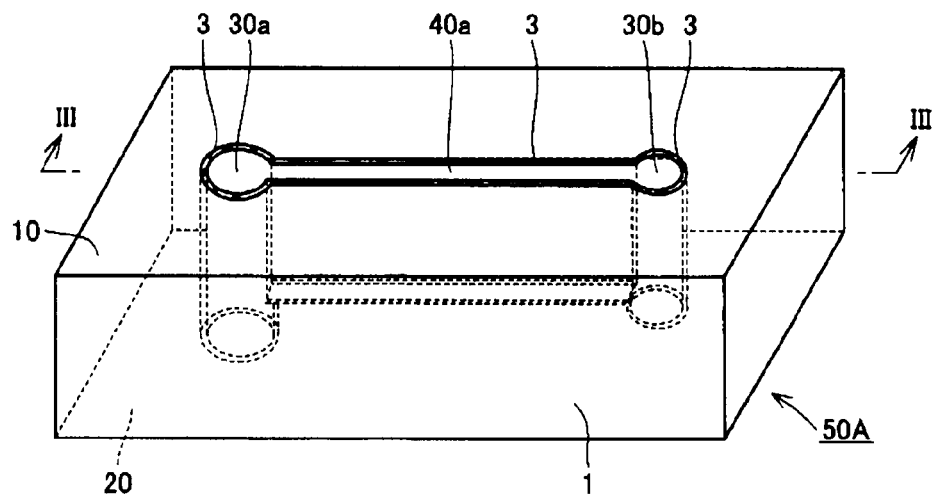
FIG. 1 is a perspective view showing an entire configuration of a semiconductor device in a first embodiment.
Figure 2:
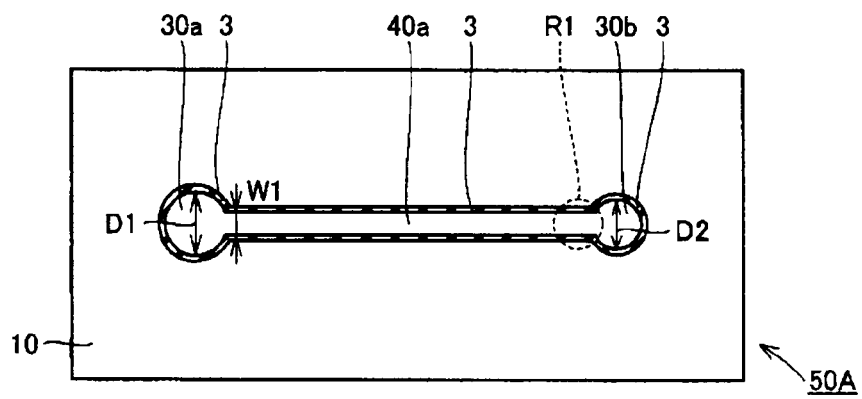
FIG. 2 is a plan view showing the entire configuration of the semiconductor device in the first embodiment.
Figure 3:
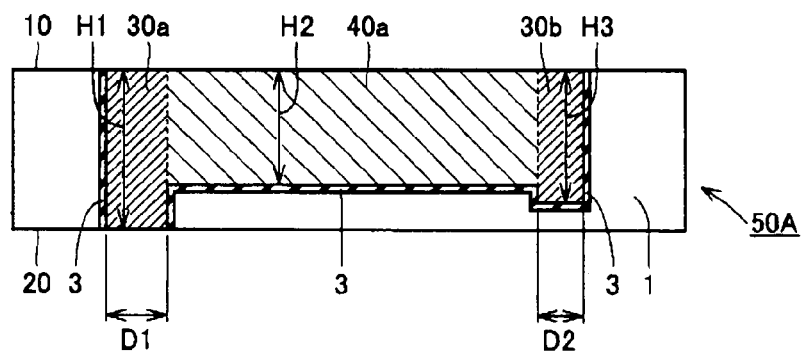
FIG. 3 is a cross section along line III-III in FIG. 1.

Referring to FIGS. 1, 2 and 3, a semiconductor device 50A in the present embodiment will be described. Semiconductor device 50A includes a semiconductor substrate 1, an electrode 30a, an electrode 30b, an interconnect portion 40a, and a first insulating film 3. Semiconductor substrate 1 has a first main surface 10 and a second main surface 20. Electrodes 30a and 30b are provided to extend from first main surface 10 in the direction of the depth of semiconductor substrate 1. Electrodes 30a and 30b are separated from each other.

Interconnect portion 40a connects electrodes 30a and 30b to each other and also extends from first main surface 10 in the depth direction of semiconductor substrate 1 without passing through semiconductor substrate 1. In the present embodiment, height H1 (FIG. 3) of electrode 30a is larger than height H2 of interconnect portion 40a and height H3 of electrode 30b. Interconnect portion 40a is exposed on first main surface 10 side only, and is not exposed on second main surface 20 side.

First insulating film 3 is provided between electrodes 30a, 30b and interconnect portion 40a, and semiconductor substrate 1. Thus, first insulating film 3 electrically insulates electrodes 30a, 30b and interconnect portion 40a from semiconductor substrate 1.

Interconnect portion 40a electrically connects electrodes 30a and 30b to each other. Accordingly, the lower end of electrode 30a and the upper end of electrode 30b are electrically conductively connected. Electrode 30a, which is at least one of electrodes 30a and 30b electrically connected by interconnect portion 40a, runs through semiconductor substrate 1 to reach second main surface 20. Electrode 30a is thus a through electrode.

Referring to FIG. 2, electrode 30a which is a through electrode is formed so that the shape as seen on first main surface 10 is substantially circular in plan view. In the portion where electrode 30a and interconnect portion 40a abut on each other, width W1 of interconnect portion 40a coupled to electrode 30a is smaller than diameter D1 of electrode 30a. The semiconductor device is configured so that electrode 30a passes through semiconductor substrate 1 while interconnect portion 40a does not pass through semiconductor substrate 1 because of the so-called loading effect exhibited when semiconductor substrate 1 is etched from first main surface 10.

Regarding semiconductor device 50A in the present embodiment, this semiconductor device 50A can be used as an interconnect electrode. Specifically, the lower end of electrode 30a and the upper end of electrode 30b that are electrically conductively connected while separated from each other may be used as interconnect electrodes serving as electrical input and output. Semiconductor device 50A in the present embodiment includes interconnect portion 40a and accordingly, electrodes 30a and 30b can be electrically conductively connected without an external interconnect (another component) such as an electrode pattern connecting electrodes 30a and 30b that is exposed on second main surface 20 side.

Figure 4:
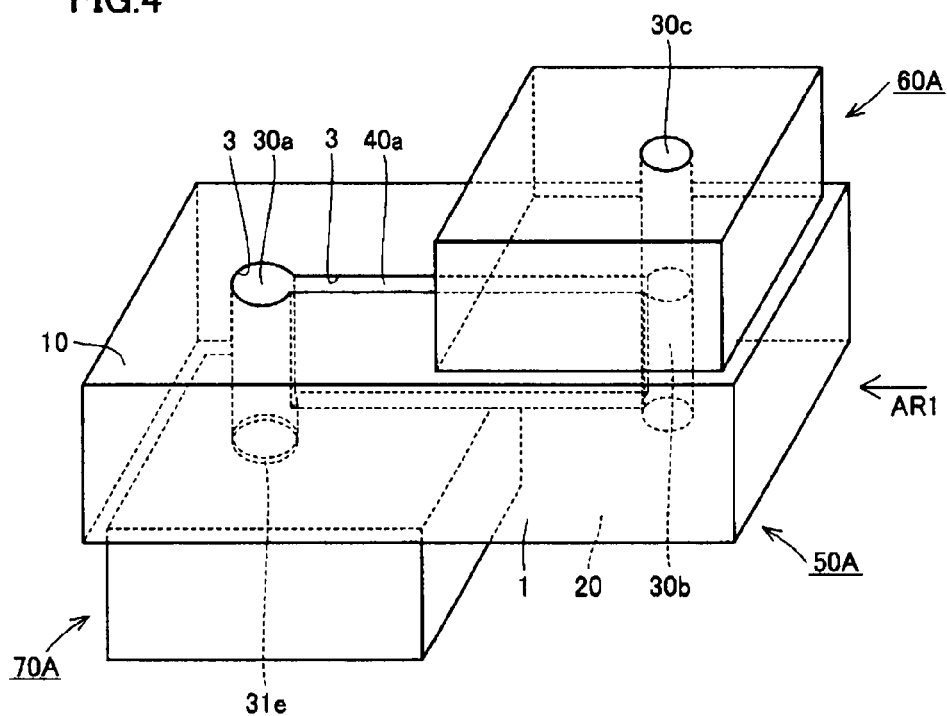
FIG. 4 is a perspective view showing a configuration where semiconductor devices are three-dimensionally mounted in the first embodiment.

Use of semiconductor device 50A in the present embodiment as an interconnect electrode will be described. Referring to FIG. 4, a semiconductor device 60A, which is referred to for example as a first semiconductor device, is provided to contact first main surface 10 of semiconductor device 50A, and a semiconductor device 70A referred to as a second semiconductor device is provided to contact second main surface 20 of semiconductor device 50A.

Specifically, semiconductor device 60A includes an electrode 30c that is a through electrode. The upper end of electrode 30c is electrically connected to a semiconductor element portion formed at the upper surface of semiconductor device 60A. The lower end of electrode 30c is electrically connected to the upper surface of electrode 30b of semiconductor device 50A.

Semiconductor device 70A includes a terminal electrode 31e extending from a semiconductor element portion formed at the upper surface. Terminal electrode 31e and electrode 30a of semiconductor device 50A are electrically connected with an electrode pad (not shown) provided therebetween. Electrodes 30a and 30b of semiconductor device 50A are electrically connected by interconnect portion 40a. This configuration allows the semiconductor element portion formed at the upper surface of semiconductor device 70A and the semiconductor element portion formed at the upper surface of semiconductor device 60A to be electrically connected to each other. In FIG. 4, first insulating film 3 is shown schematically.

Here, semiconductor devices 50A, 60A and 70A are stacked in the vertical direction, while electrodes 30a and 30c that are through electrodes are not arranged to overlap in the vertical direction.

Electrodes 30a and 30c that are through electrodes are arranged so that these electrodes are separated by the length of interconnect portion 40a in the lateral direction as seen in FIG. 4. Semiconductor device 50A in the present embodiment includes interconnect portion 40a, and accordingly it is unnecessary to arrange electrode 30a of semiconductor device 50A and electrode 30c of semiconductor device 60A in such a manner that they overlap in the vertical direction.

Referring to FIGS. 2 and 4, it is supposed by way of example that electrode 30c of semiconductor device 60A is disposed at a position displaced to the left as seen in FIG. 2 due to a manufacture error or the like, and thus disposed at the position of a region R1 (FIG. 2). In this case as well, electrical connection between electrode 30c and interconnect portion 40a can be ensured since interconnect portion 40a is provided to extend leftward from electrode 30b as seen in FIG. 2.

Therefore, in semiconductor device 50A of the present embodiment, even if a positional displacement occurs along the direction in which interconnect portion 40a extends, electrical connection can still be ensured. Respective positions of a plurality of electrodes connected to interconnect portion 40a can be changed freely by adjusting the length of interconnect portion 40a. The degree of freedom in designing the semiconductor device can therefore be enhanced.

For semiconductor device 50A in the present embodiment, it is unnecessary that electrode 30a of semiconductor device 50A and electrode 30c of semiconductor device 60A are arranged to overlap in the vertical direction, and thus the degree of freedom in arrangement of each semiconductor element is not restricted. Accordingly, the degree of design freedom in terms of arrangement of each semiconductor element can be enhanced, and increase in size of the semiconductor device as a whole that is completed as a product can be suppressed.

Referring again to FIG. 2, for semiconductor device 50A in the present embodiment, it is unnecessary that respective electrodes 30a and 30c of semiconductor devices 50A and 60A are provided in such a manner that they overlap vertically, and thus diameter D2 of electrode 30b can be smaller than diameter D1 of electrode 30a. Since diameter D2 of electrode 30b can be made smaller, the diameter of electrode 30c provided at semiconductor device 60A stacked on first main surface 10 of semiconductor device 50A can also be made smaller. Accordingly, the degree of freedom in arrangement of each semiconductor element of semiconductor device 60A can be enhanced, and further, increase in the size of semiconductor device 60A completed as a product can also be suppressed.

While the semiconductor element portion is formed on the upper surface side of semiconductor device 70A, interconnect portion 40a of semiconductor device 50A is not exposed on second main surface 20 side. Therefore, the semiconductor element portion formed on the upper surface side of semiconductor device 70A is electrically insulated from interconnect portion 40a of semiconductor device 50A with semiconductor substrate 1 therebetween. Regarding semiconductor device 50A in the present embodiment, electrical insulation from a semiconductor element of another semiconductor device 70A disposed on second main surface 20 of semiconductor device 50A can be ensured, and electrical interconnection can be made only through electrode 30a and terminal electrode 31e.

Another Configuration of First Embodiment

Figure 5:
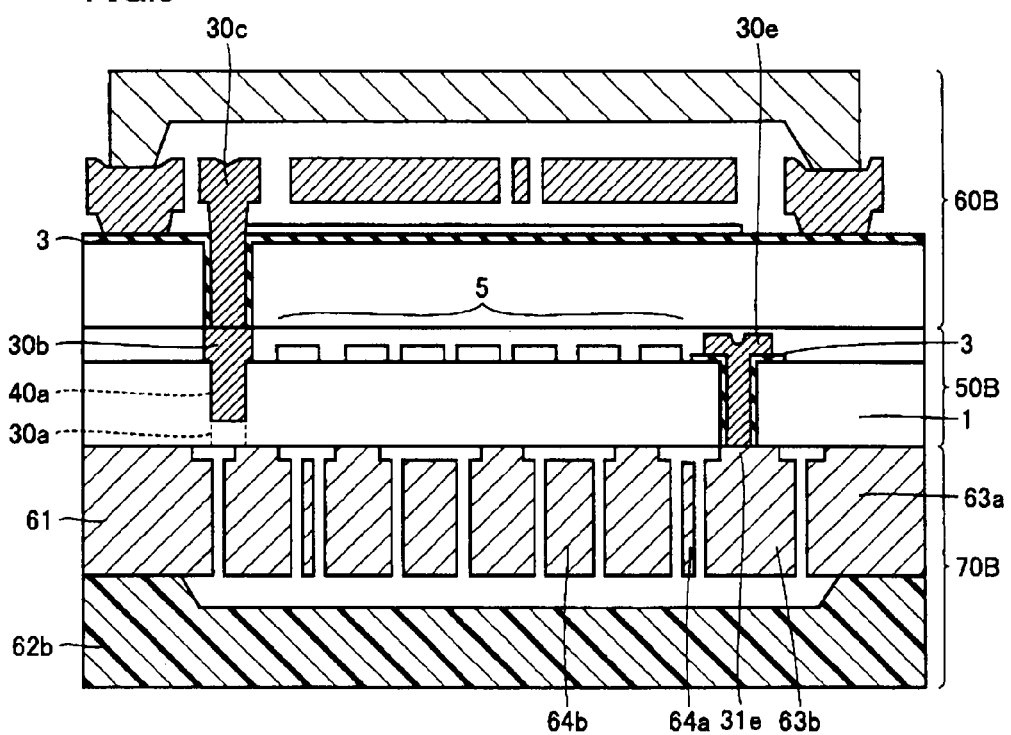
FIG. 5 is a cross section showing another configuration where semiconductor devices are three-dimensionally mounted in the first embodiment.

Referring to FIG. 5, a semiconductor device 50B having another configuration in the first embodiment will be described.

Specifically, semiconductor device 50B includes three electrodes, namely electrodes 30a, 30b and 30e, and an interconnect portion 40a. Interconnect portion 40a electrically connects electrodes 30a and 30b. Interconnect portion 40a extends in the direction perpendicular to the plane of FIG. 5. Electrodes 30a and 30b are electrically insulated from electrode 30e.

A semiconductor device 60B includes an electrode 30c that is a through electrode electrically connected to a semiconductor element portion formed at the upper surface of semiconductor device 60B and extends in the thickness direction. Electrode 30c is covered with a first insulating film 3.

A semiconductor device 70B includes a Si substrate 61. Semiconductor device 70B includes a cap portion 62b. In Si substrate 61, support portions 63a and 63b and floating portions 64a and 64b are formed. Support portions 63a and 63b are connected to cap portion 62b.

Electrodes 30a, 30b, 30c and interconnect portion 40a shown in FIG. 5 correspond to electrodes 30a, 30b, 30c and interconnect portion 40a as seen in the direction of arrow AR1 in FIG. 4.

The upper end of electrode 30b of semiconductor device 50B is electrically connected to the lower end of electrode 30c of semiconductor device 60B. The lower end of electrode 30e of semiconductor device 50B is electrically connected to a terminal electrode 31e formed at the upper surface of support portion 63b of semiconductor device 70B.

One interconnect path is formed through electrodes 30a and 30b and interconnect portion 40a that connects semiconductor devices 50B, 60B and 70B. Further, another interconnect path is formed through electrode 30e that connects semiconductor devices 50B and 70B. For semiconductor device 50B in the present embodiment, a plurality of electrical interconnect paths connecting semiconductor device 50B to another semiconductor device 60B or 70B can be formed.

The length of interconnect portion 40a connecting electrodes 30a and 30b may be changed freely, so that the degree of freedom in arrangement of each semiconductor element formed in semiconductor device 50B is not restricted by electrodes 30a and 30b. Accordingly, increase in size of the semiconductor device as whole that is completed as a product can be suppressed.

By freely changing the length of interconnect portion 40a connecting electrodes 30a and 30b, the degree of freedom in arrangement of each semiconductor element of semiconductor device 60B stacked with semiconductor device 50B can be enhanced and further, increase in size of semiconductor device 60B completed as a product can also be suppressed.

The position of electrode 30e that is a through electrode may be changed freely as well. By freely changing the position of electrode 30e that is a through electrode, the degree of freedom in arrangement of each semiconductor element of semiconductor device 70B stacked with semiconductor device 50B can be enhanced and further, increase in size of semiconductor device 70B completed as a product can also be suppressed.

Electrode 30e and an electrode that is another through electrode different from electrode 30e may be further provided and another interconnect electrode connecting these electrodes may be provided. By freely changing the length of this interconnect electrode, the degree of freedom in arrangement of each semiconductor element of semiconductor device 70B stacked with semiconductor device 50B can be enhanced, and further, increase in size of semiconductor device 70B completed as a product can also be suppressed.

Still Another Configuration of First Embodiment

Electrodes 30a, 30b and interconnect portion 40a exert stress on semiconductor substrate 1 through first insulating film 3. When the depth of electrodes 30a, 30b and interconnect portion 40a is approximately 100 μm or more, the influence due to the stress acting on semiconductor substrate 1 is not negligible in some cases.

In view of this, the material for electrodes 30a, 30b and interconnect portion 40a may preferably be a doped polysilicon deposited under conditions such as temperature, concentration, pressure, and heat treatment for example optimized to relax the stress exerted by first insulating film 3 on semiconductor substrate 1.

Specifically, depending on the stress exerted by first insulating film 3 on semiconductor substrate 1, a doped polysilicon that functions to reduce the stress may be used. For example, in the case where first insulating film 3 is deposited with a compressive stress acting on semiconductor substrate 1, a tensile doped polysilicon may be used for electrodes 30a, 30b and interconnect portion 40a. In the case where first insulating film 3 is deposited with a tensile stress acting on semiconductor substrate 1, a compressive doped polysilicon may be used for electrodes 30a, 30b and interconnect portion 40a.

In this way, the stress exerted on semiconductor substrate 1 by first insulating film 3 and a doped polysilicon used as a material for, electrodes 30a, 30b and interconnect portion 40a can be relaxed. Moreover, by using a doped polysilicon as a material for electrodes 30a, 30b and interconnect portion 40a, the process for making electrical conduction is unnecessary because the doped polysilicon itself is electrically conductive.

Second Embodiment

Figure 6:
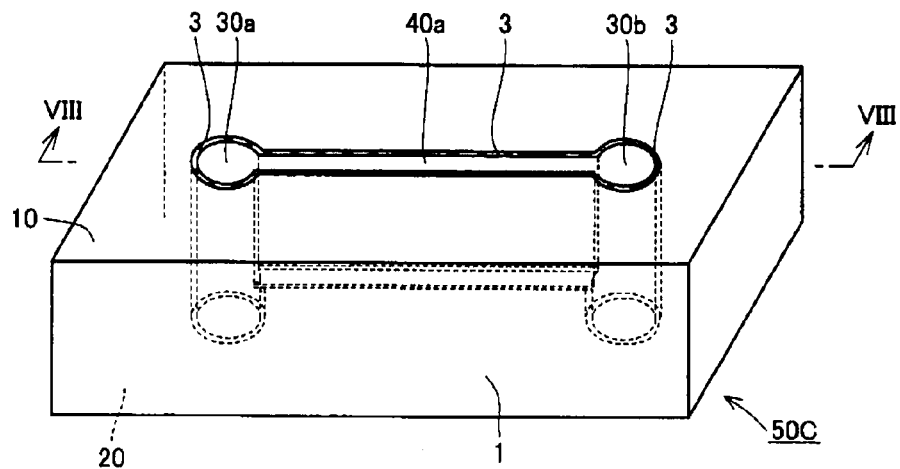
FIG. 6 is a perspective view showing an entire configuration of a semiconductor device in a second embodiment.
Figure 7:
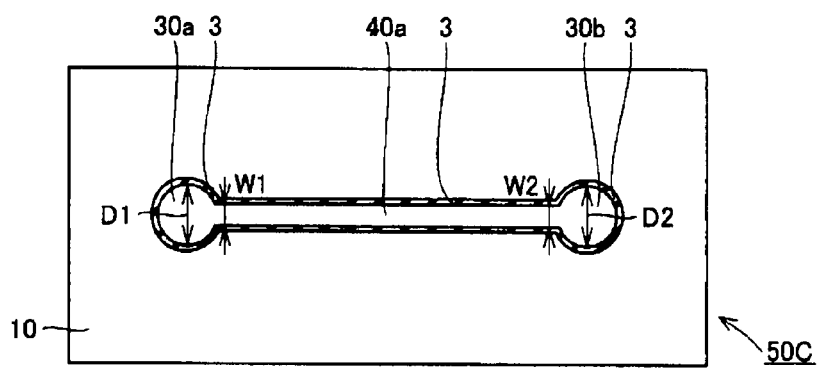
FIG. 7 is a plan view showing the entire configuration of the semiconductor device in the second embodiment.
Figure 8:
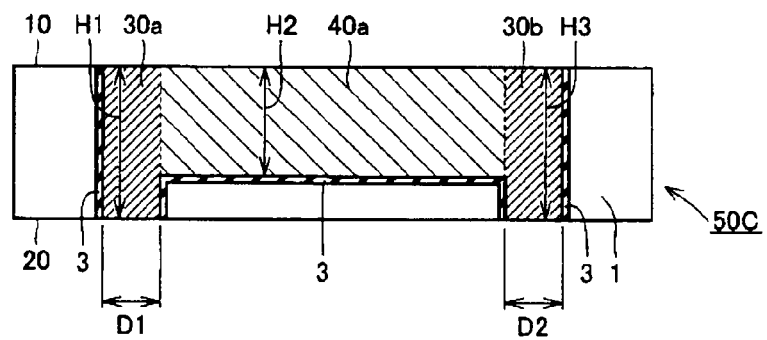
FIG. 8 is a cross section along line VIII-VIII in FIG. 6.

Referring to FIGS. 6, 7 and 8, a semiconductor device 50C in the present embodiment will be described. A difference between semiconductor device 50C and semiconductor device 50A in the first embodiment is in electrode 30b. Electrode 30b of semiconductor device 50C, like electrode 30a which is a through electrode, runs through semiconductor substrate 1 to reach second main surface 20. Namely, both of electrodes 30a and 30b are through electrodes. Height H1 of electrode 30a and height H3 (FIG. 8) of electrode 30b are substantially equal to each other, and these heights are both larger than height H2 of interconnect portion 40a.

Referring to FIG. 7, electrodes 30a and 30b that are through electrodes are each formed with a circular shape as seen on first main surface 10. In the portion where electrode 30a and interconnect portion 40a abut on each other, width W1 of interconnect portion 40a coupled to electrode 30a is smaller than diameter D1 of electrode 30a. In the portion where electrode 30b and interconnect portion 40a abut on each other, width W2 of interconnect portion 40a coupled to electrode 30b is smaller than diameter D2 of electrode 30b. Like the first embodiment, interconnect portion 40a is not exposed on second main surface 20 side. Other features are similar to those of semiconductor device 50A.

For semiconductor device 50C in the present embodiment, the lower end of electrode 30a and the lower end of electrode 30b that are electrically conductively connected and are separated from each other can be used as interconnect electrodes serving as electrical input and output.

Figure 9:
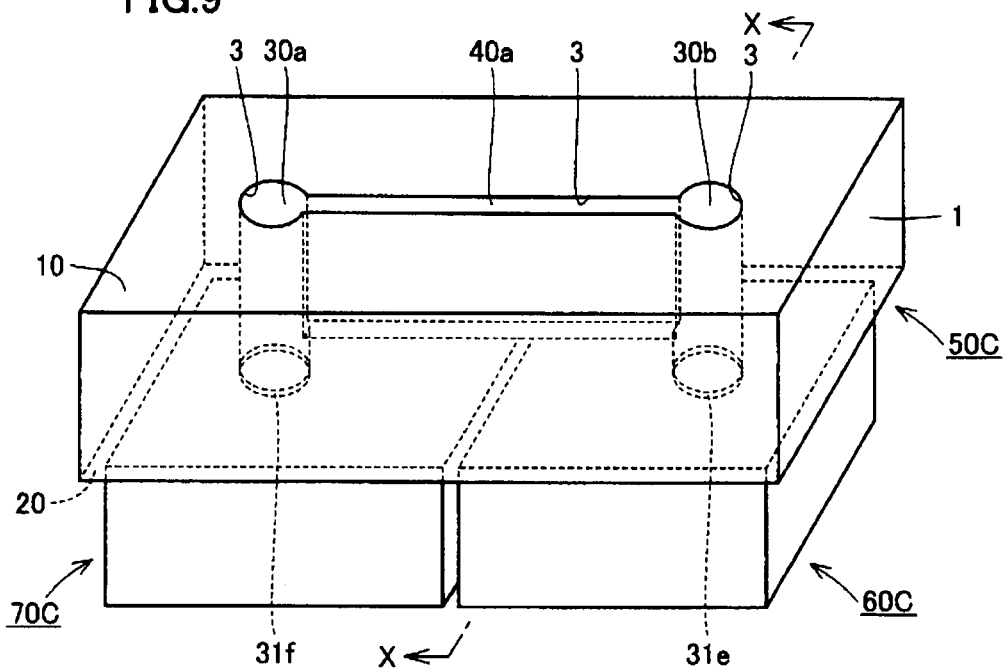
FIG. 9 is a perspective view showing a configuration where semiconductor devices are three-dimensionally mounted in the second embodiment.
Figure 10:
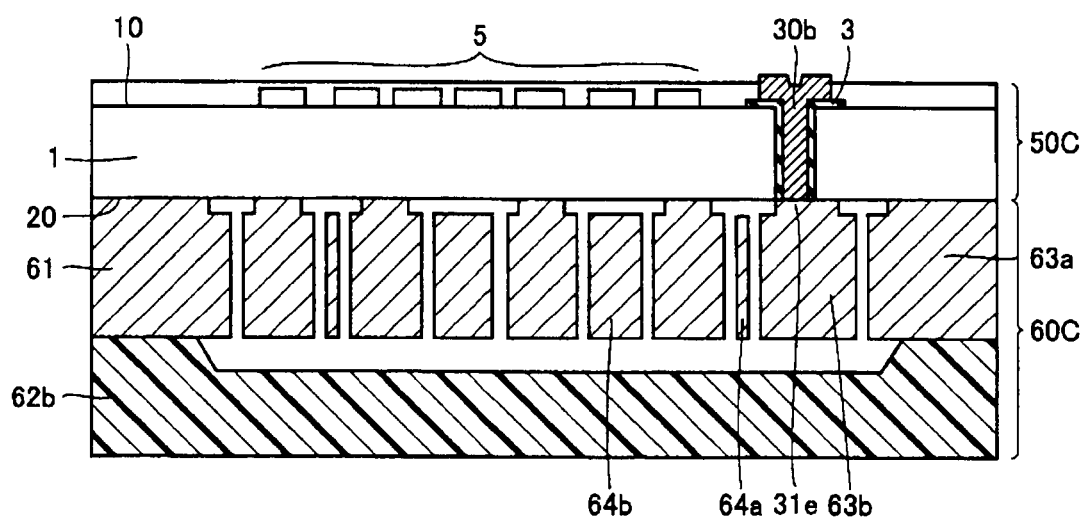
FIG. 10 is a cross section along line X-X in FIG. 9.

Use of semiconductor device 50C in the present embodiment as an interconnect electrode will be described. Referring to FIGS. 9 and 10, for semiconductor device 50C in the present embodiment, both of semiconductor devices 60C and 70C can be provided so that they contact second main surface 20 of semiconductor device 50C. Semiconductor device 50C is stacked on semiconductor devices 60C and 70C in the vertical direction. Semiconductor devices 60C and 70C are arranged side by side in the lateral direction. In FIG. 9, first insulating film 3 is shown schematically.

Semiconductor device 60C includes a cap portion 62b. In a Si substrate 61, support portions 63a and 63b and floating portions 64a and 64b are formed. Support portions 63a and 63b are connected to cap portion 62b. Semiconductor device 70C is configured similarly to semiconductor device 60C.

Electrode 30b of semiconductor device 50C is electrically connected to a terminal electrode 31e formed at the upper surface of support portion 63b of semiconductor device 60C. Likewise, electrode 30a of semiconductor device 50C is electrically connected to a terminal electrode 31f (FIG. 9) formed at the upper surface of a support portion of semiconductor device 70C. Electrodes 30a and 30b and interconnect portion 40a can be used as interconnect electrodes, and semiconductor devices 60C and 70C are electrically connected. By changing the length of interconnect portion 40a, respective positions of electrodes 30a and 30b connected to interconnect portion 40a can be changed freely, and thus the degree of freedom in designing semiconductor devices 50C, 60C and 70C each can be enhanced.

While semiconductor element portions are formed on the upper surface side of semiconductor devices 60C and 70C, interconnect portion 40a is not exposed on second main surface 20 side like the first embodiment and therefore, the semiconductor element portions formed on the upper surface side of semiconductor devices 60C and 70C and interconnect portion 40a of semiconductor device 50C are electrically insulated from each other with semiconductor substrate 1 therebetween. For semiconductor device 50C in the present embodiment, electrical insulation from the semiconductor elements of other semiconductor devices 60C and 70C arranged on second main surface 20 of semiconductor device 50C can be ensured, and electrical interconnection can be made through only electrodes 30a and 30b.

Another Configuration of Second Embodiment

Figure 11:
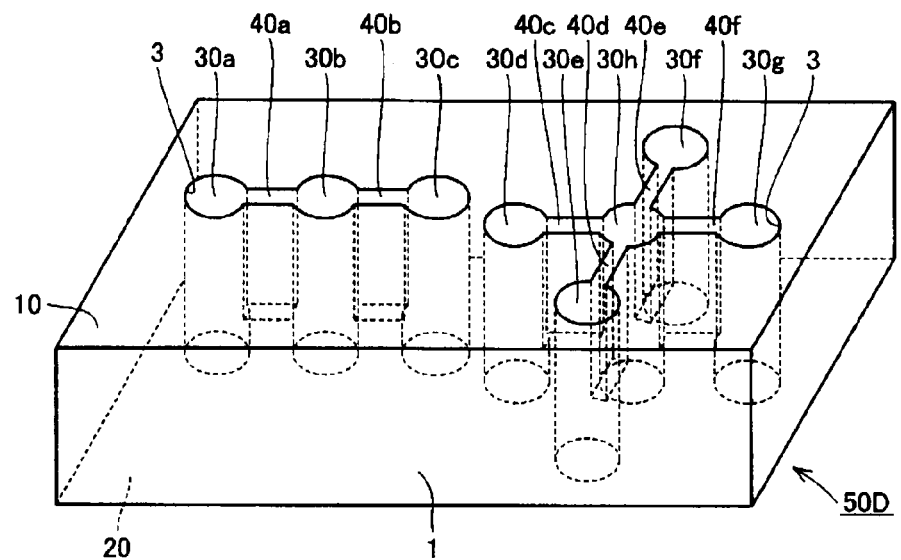
FIG. 11 is a perspective view showing an entire configuration of another semiconductor device in the second embodiment.

Referring to FIG. 11, a semiconductor device 50D having another configuration in the second embodiment will be described. In connection with the first and second embodiments, the configuration of two electrodes and an interconnect portion connecting these electrodes has been described. Instead, a configuration of three or more electrodes and interconnect portions connecting these electrodes may be provided. For example, as shown on the left side of FIG. 11, semiconductor device 50D may be configured to include three electrodes, namely electrodes 30a, 30b and 30c, an interconnect portion 40a connecting electrodes 30a and 30b and an interconnect portion 40b connecting electrodes 30b and 30c.

While electrodes 30a, 30b and 30c are all through electrodes, any one of electrodes 30a, 30b and 30c may be a through electrode like the first embodiment.

In this configuration, the lower end of electrode 30a and the upper end and the lower end of electrode 30b are electrically connected. Further, the lower end of electrode 30a and the upper end and the lower end of electrode 30c are electrically connected. Respective lengths of interconnect portions 40a and 40b can be changed in various manners to enhance the degree of design freedom in arrangement of each semiconductor element.

As shown on the right side of FIG. 11, electrodes 30d to 30h and interconnect portions 40c to 40f may be configured so that a cross is formed with electrode 30h at the center. In FIG. 11, electrodes 30d to 30h are all through electrodes. Here, any one of electrodes 30d to 30h may be a through electrode.

In this configuration, for example, the lower end of electrode 30d and the upper end and the lower end of electrode 30g are electrically connected. Further, the lower end of electrode 30e and the upper end and the lower end of electrode 30f are electrically connected. By changing respective lengths of interconnect portions 40c to 40f in various manners and changing the angle formed by interconnect portions 40c to 40f with respect to each other with electrode 30h therebetween, the degree of design freedom in arrangement of each semiconductor element can be enhanced.

On the left side of FIG. 11, only a part of first insulating film 3 is schematically shown. Actually, however, first insulating film 3 is provided to extend between electrodes 30a, 30b, 30c and interconnect portions 40a, 40b, and semiconductor substrate 1. On the right side of FIG. 11, only a part of first insulating film 3 is schematically shown. Actually, however, first insulating film 3 is provided to extend between electrodes 30d to 30h and interconnect portions 40d to 40f, and semiconductor substrate 1.

Still Another Configuration of Second Embodiment

Figure 12:
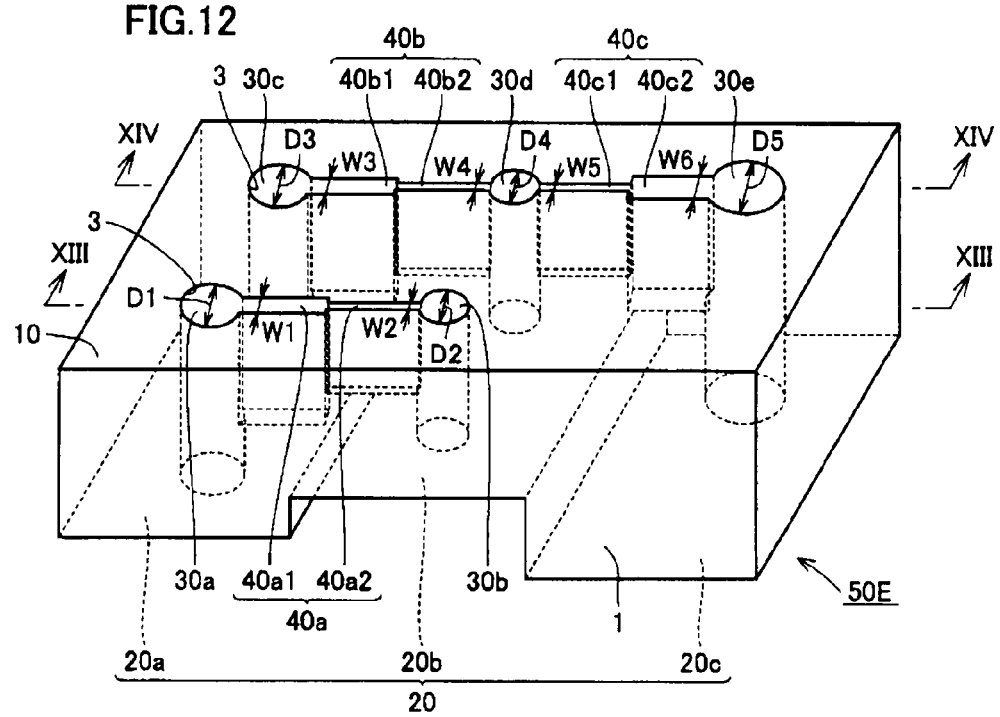
FIG. 12 is a perspective view showing an entire configuration of still another semiconductor device in the second embodiment.
Figure 13:
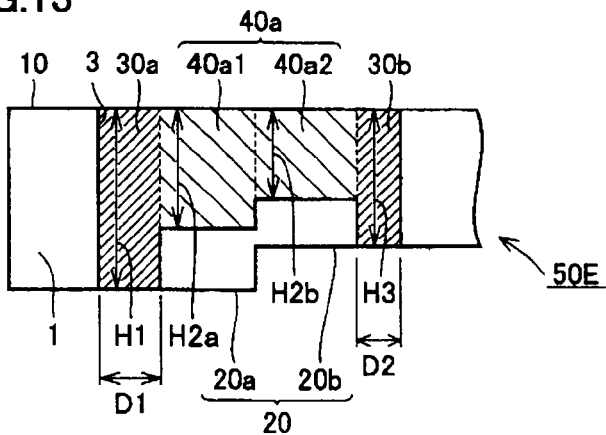
FIG. 13 is a cross section along line XIII-XIII in FIG. 12.
Figure 14:
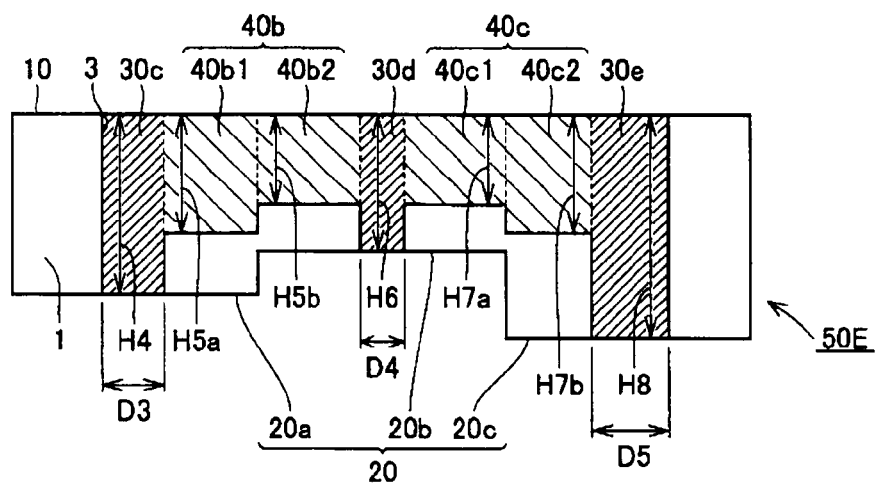
FIG. 14 is a cross section along line XIV-XIV in FIG. 12.

Referring to FIGS. 12, 13 and 14, a semiconductor device 50E having still another configuration in the present embodiment will be described. Referring to the front side of FIG. 12 and to FIG. 13, this configuration and the above-described configuration in the second embodiment differ from each other in how second main surface 20 is configured. Specifically, second main surface 20 includes a third main surface 20a and a fourth main surface 20b. The thickness from first main surface 10 to fourth main surface 20b is relatively smaller than the thickness from first main surface 10 to third main surface 20a.

An electrode 30a formed as a through electrode extends from first main surface 10 to reach third main surface 20a through semiconductor substrate 1. An electrode 30b also formed as a through electrode extends from first main surface 10 to reach fourth main surface 20b through semiconductor substrate 1.

An interconnect portion 40a1 and an interconnect portion 40a2 are electrically conductively connected to each other. In the portion where electrode 30a and interconnect portion 40a1 abut on each other, width W1 of interconnect portion 40a1 coupled to electrode 30a is smaller than diameter D1 of electrode 30a. In the portion where electrode 30b and interconnect portion 40a2 abut on each other, width W2 of interconnect portion 40a2 coupled to electrode 30b is smaller than diameter D2 of electrode 30b. Width W1 of interconnect portion 40a1 is larger than width W2 of interconnect portion 40a2.

Respective diameters of electrodes 30a, 30b and respective widths of interconnect portions 40a1, 40a2 are defined in the above-described manner. Thus, the electrodes and interconnect portions can be formed using the loading effect in the etching process so that only electrodes 30a and 30b run through semiconductor substrate 1 while interconnect portions 40a1 and 40a2 do not run through semiconductor substrate 1.

Height H1 (FIG. 13) of electrode 30a is larger than height H2a of interconnect portion 40a1. Height H3 (FIG. 13) of electrode 30b is larger than height H2b of interconnect portion 40a2. Interconnect portions 40a1 and 40a2 are not exposed on third main surface 20a side and fourth main surface 20b side.

In semiconductor device 50E of the present embodiment, second main surface 20 has a step or level difference (between third main surface 20a and fourth main surface 20b). Thus, this level difference can be used to enhance the degree of design freedom in arranging each semiconductor element. Without other complicated components such as external interconnect exposed on second main surface 20 side, electrodes 30a and 30b can be electrically connected by interconnect portion 40a. Further, semiconductor device 50E can be designed to adapt to any unevenness of the surface of another semiconductor device to be connected to semiconductor device 50E. Accordingly, increase in size of the semiconductor device completed as a product can be suppressed.

Referring to the rear side of FIG. 12 and to FIG. 14, second main surface 20 may further include another main surface 20c. Electrodes 30c to 30e are all formed as through electrodes. An interconnect portion 40b (interconnect portions 40b1 and 40b2) and an interconnect portion 40c (interconnect portions 40c1 and 40c2) are configured similarly to above-described interconnect portions 40a1 and 40a2.

Specifically, in the portion where electrode 30c and interconnect portion 40b1 abut on each other, width W3 of interconnect portion 40b1 coupled to electrode 30c is smaller than diameter D3 of electrode 30c. In the portion where electrode 30d and interconnect portion 40b2 abut on each other, width W4 of interconnect portion 40b2 coupled to electrode 30d is smaller than diameter D4 of electrode 30d. In the portion where electrode 30d and interconnect portion 40c1 abut on each other, width W5 of interconnect portion 40c1 coupled to electrode 30d is smaller than diameter D4 of electrode 30d.

In the portion where electrode 30e and interconnect portion 40c2 abut on each other, width W6 of interconnect portion 40c2 coupled to electrode 30e is smaller than diameter D5 of electrode 30e. Width W3 of interconnect portion 40b1 is larger than with W4 of interconnect portion 40b2. Width W5 of interconnect portion 40c1 is smaller than width W6 of interconnect portion 40c2.

Respective diameters of electrodes 30c, 30d, 30e and respective widths of interconnect portions 40b1, 40b2, 40c1, 40c2 are defined as described above. Thus, the electrodes and interconnect portions can be formed using the loading effect in the etching process so that only electrodes 30c, 30d and 30e run through semiconductor substrate 1 while interconnect portions 40b1, 40b2, 40c1, and 40c2 do not run through semiconductor substrate 1.

Height H4 (FIG. 14) of electrode 30c is larger than height H5a of interconnect portion 40b1. Height H6 (FIG. 14) of electrode 30d is larger than height H5b of interconnect portion 40b2 and height H7a of interconnect portion 40c1. Height H8 (FIG. 14) of electrode 30e is larger than height H7b of interconnect portion 40c2. Interconnect portions 40b1, 40b2, 40c1, and 40c2 do not expose on third and fourth main surfaces 20a and 20b and another main surface 20c.

For semiconductor device 50E in the present embodiment, second main surface 20 may have a plurality of steps or level differences. The level differences can be used to enhance the degree of design freedom in arranging each semiconductor element. For example, semiconductor device 50E can be designed to adapt to the unevenness of the surface of another semiconductor device to be connected to semiconductor device 50E. Further, for semiconductor device 50E in the present embodiment, it is unnecessary to have other complicated components such as external interconnect. Accordingly, increase in size of the whole semiconductor device completed as a product can be suppressed.

In FIG. 12, only a part of first insulating film 3 is schematically shown. Actually, however, first insulating film 3 is formed to extend between electrodes 30a, 30b, interconnect portion 40a, electrodes 30c to 30e, interconnect portions 40b, 40c, and semiconductor substrate 1.

Third Embodiment

Figure 15:
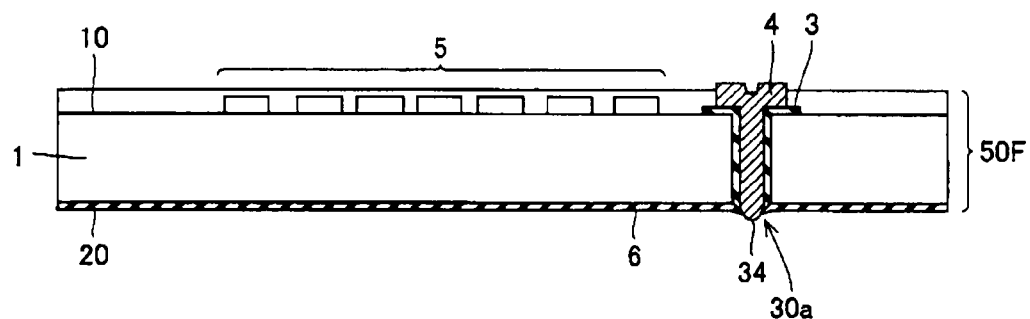
FIG. 15 is a cross section showing an entire configuration of a semiconductor device in a third embodiment.
Figure 16:
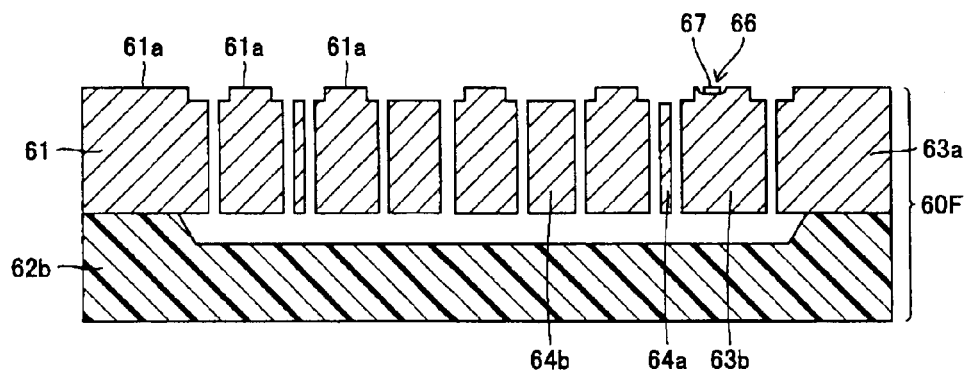
FIG. 16 is a cross section showing another semiconductor device to be connected to the semiconductor device in the third embodiment.
Figure 17:
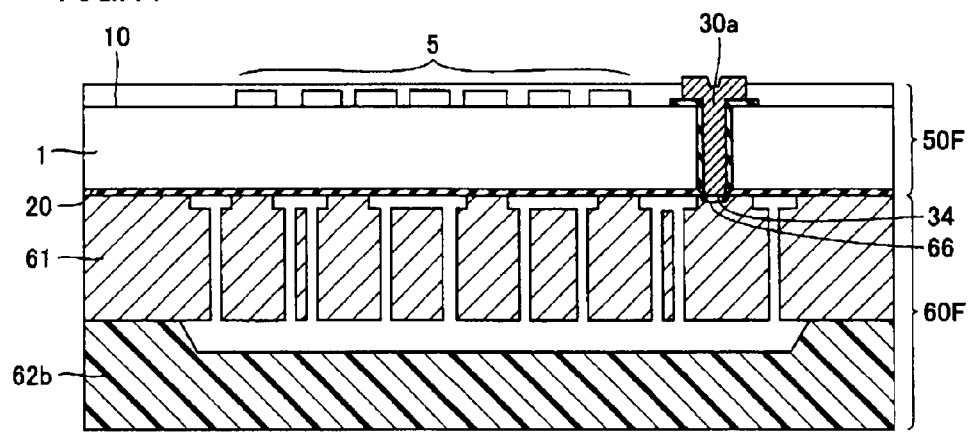
FIG. 17 is a cross section showing a configuration where the semiconductor device and the other semiconductor device in the third embodiment are three-dimensionally mounted.

Referring to FIGS. 15, 16 and 17, a semiconductor device 50F in the present embodiment will be described. A method of manufacturing semiconductor device 50F will be described later with reference to FIGS. 32 to 42. Referring to FIG. 15, a second main surface 20 of semiconductor device 50F is covered with a second insulating film 6 except for the portion where an electrode 30a that is a through electrode is provided. Further, a lower end 34 of electrode 30a formed as a through electrode is exposed from second insulating film 6. Other features are similar to those of the first or second embodiment.

Figure 45:
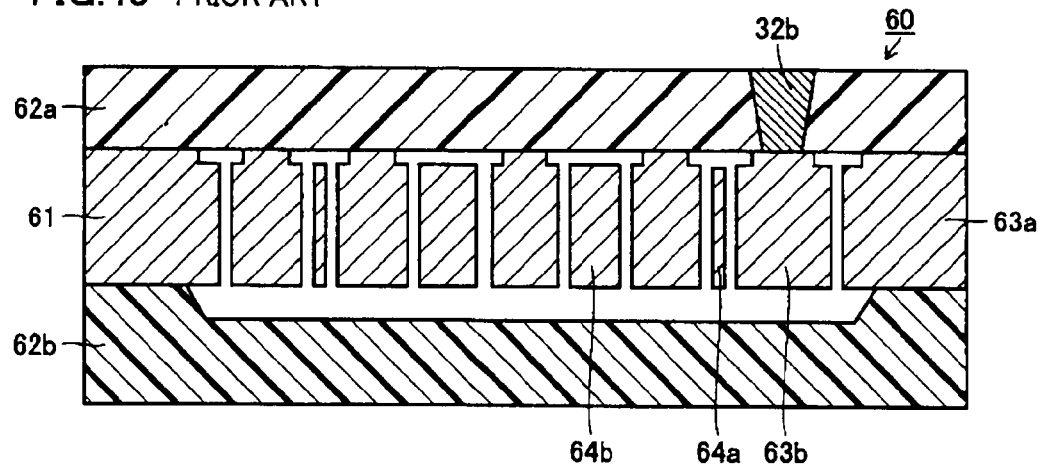
FIG. 45 is a cross section showing a common semiconductor device provided as a semiconductor acceleration sensor having a thin-film structure.
Figure 46:
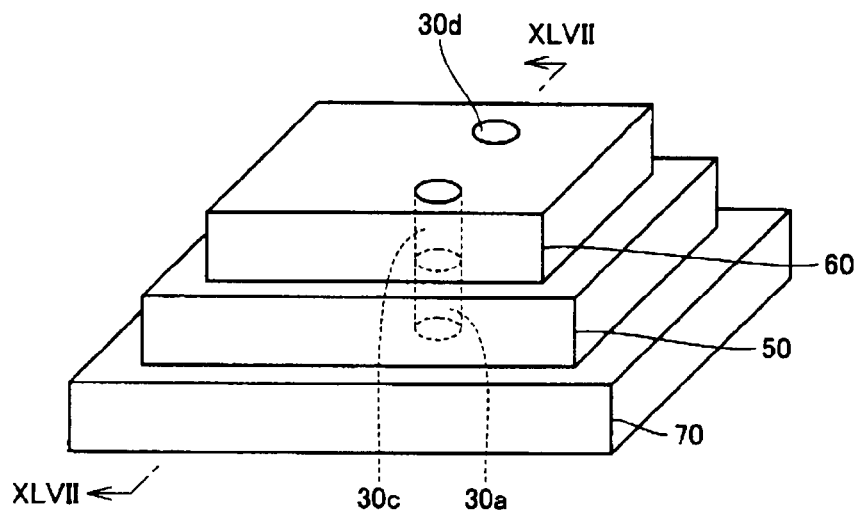
FIG. 46 is a perspective view showing a configuration where a common semiconductor device provided as an integrated circuit and two semiconductor devices provided as semiconductor acceleration sensors are vertically stacked.
Figure 47:
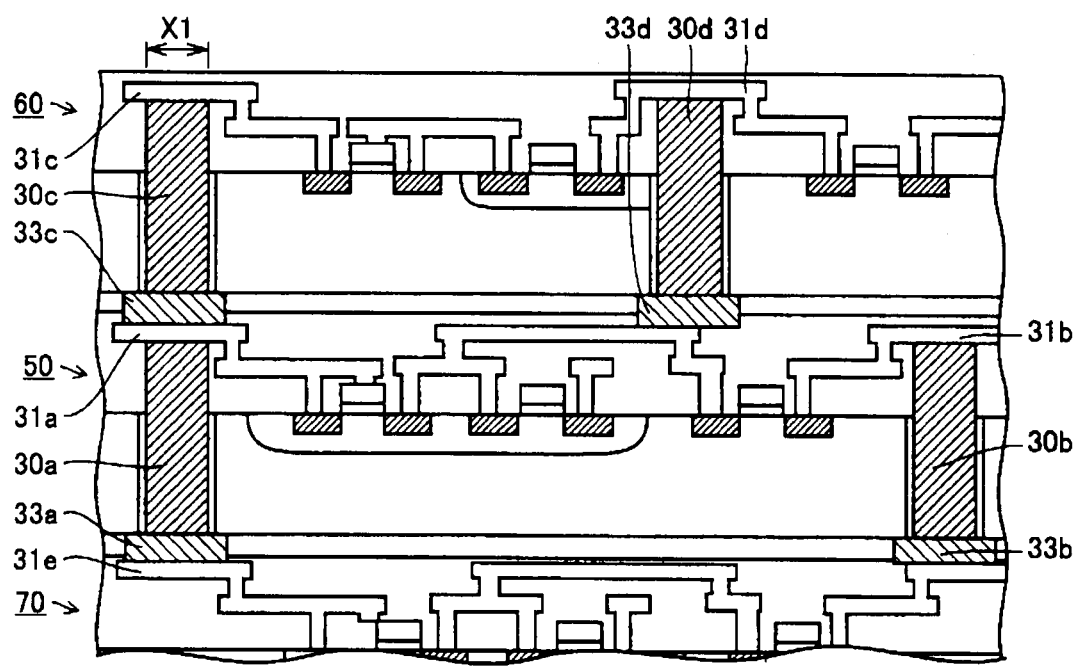
FIG. 47 is a cross section along line XLVII-XLVII in FIG. 46.

Referring to FIG. 16, a semiconductor device 60F to be connected to semiconductor device 50F will be described. Semiconductor device 60F includes a Si substrate 61. As for the cap portion described with reference to FIG. 45, semiconductor device 60F does not have cap portion 62a but has a cap portion 62b only. In Si substrate 61, support portions 63a and 63b and floating portions 64a and 64b are formed. Support portions 63a and 63b are connected to cap portion 62b.

In order to electrically connect to lower end 34 of electrode 30a, semiconductor device 60F includes a connecting portion 66. Connecting portion 66 is formed to recede from a surface 61a of semiconductor device 60F and have a substantially U-shaped cross section. An aluminum (AL) 67 is embedded in the surface of a substantially central portion of connecting portion 66. The uppermost end of embedded aluminum 67 is below surface 61a of semiconductor device 60F and is thus located in Si substrate 61. Connecting portion 66 is formed with a predetermined distance from the periphery of embedded aluminum 67. Thus, a gap is formed around the periphery of aluminum 67.

Referring to FIG. 17, semiconductor device 50F and semiconductor device 60F are joined together. At this time, a pressure is applied from lower end 34 of semiconductor device 50F to connecting portion 66 of semiconductor device 60F to cause aluminum (AL) 67 to have an increased volume (15% to 20%) and thereby expand to fill the gap formed around the periphery of the aluminum (see FIG. 42). In this way, when semiconductor devices 50F and 60F are joined together, more adequate connection in terms of electrical aspect can be obtained. This structure is also applicable to those shown in FIGS. 4 and 9.

Fourth Embodiment

Referring to FIGS. 18 to 21, a semiconductor device 50G1 and a semiconductor device 50G2 in the present embodiment will be described. Semiconductor devices 50G1 and 50G2 are each an IGBT or the like to which a high voltage is applied, for example, and include a guard ring that is one of means for relaxing electric field concentration at an end face of a semiconductor element.

Figure 18:
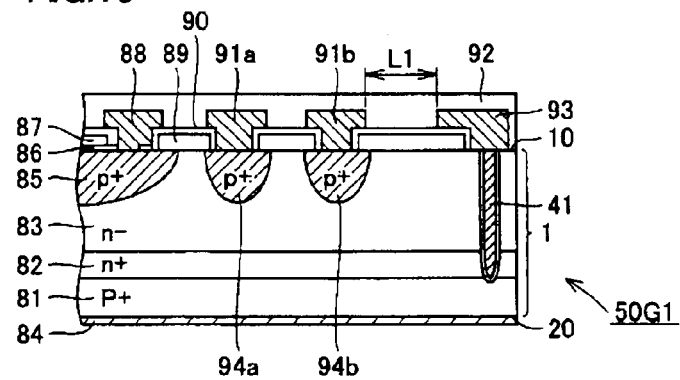
FIG. 18 is a cross section showing an entire configuration of a semiconductor device in a fourth embodiment.

FIG. 18 is a cross section showing a structure of a peripheral portion of semiconductor device 50G1. In FIG. 18, only the peripheral portion of semiconductor device 50G1 is shown. For details of a semiconductor element portion, through electrodes and interconnect portions, any of those of the first to third embodiments may be employed. The configuration in the present embodiment is therefore similar to those of the first to third embodiments, and the description thereof will not be repeated.

Semiconductor device 50G1 includes a p-type collector layer 81 of a high concentration, an n-type buffer layer 82 of a high concentration, an n-type drift layer 83 of a low concentration, a collector electrode 84, a p-conductive-type well layer 85, a gate oxide film 86, a polysilicon film 87, an aluminum electrode 88, a field oxide film 89, an interlayer film 90, aluminum plates 91a, 91b that are conductive films, a surface protection film 92, guard rings 94a, 94b each formed of a p-conductive-type well layer, an aluminum conductive film 93, and an electrode 41 serving as a channel stopper layer.

Guard rings 94a and 94b are annular in shape, extend from first main surface 10 toward second main surface 20 to a predetermined depth, and spaced from each other by a predetermined distance. A depletion layer extending from a base layer (not shown) and from the pn junction between well layer 85 and drift layer 83 is further extended by guard rings 94a, 94b and aluminum plates 91a, 91b toward the outer periphery (toward annular electrode 41) of semiconductor device 50G1. Accordingly, the electric field is relaxed.

Here, electrode 41 is provided outside guard ring 94b that is the outermost one of the guard rings, spaced from guard ring 94b by a predetermined distance, runs along annular conductive film 93 provided on first main surface 10, and extends from main surface 10 toward second main surface 20 to a predetermined depth.

Figure 19:
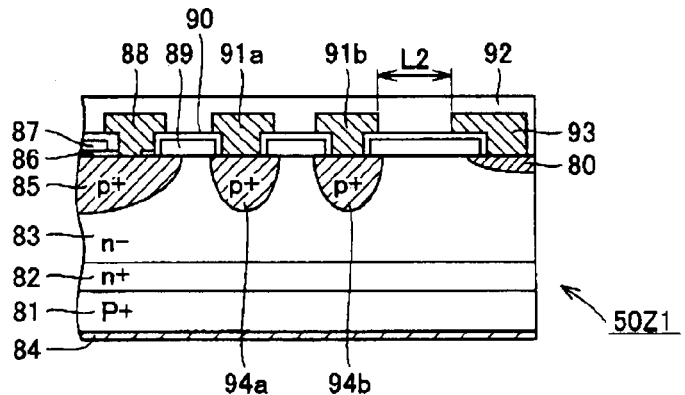
FIG. 19 is a cross section showing a comparative example to be compared with the semiconductor device in the fourth embodiment shown in FIG. 18.

Referring to FIG. 19, a common semiconductor device 50Z1 does not include annular electrode 41 but instead includes an n-type channel stopper layer 80 in the region corresponding to annular electrode 41. Channel stopper layer 80 is commonly formed by n-type ion implantation and heat treatment.

Channel stopper layer 80 of semiconductor device 50Z1 is located on a side (right side in FIG. 19) of the semiconductor element where the crystal defect density is high. Dicing of the substrate causes crystal distortion in the side of the semiconductor element. In the case where a reverse bias is applied to the side of the semiconductor element, a depletion layer is also generated in the side of the semiconductor element having undergone dicing. If extension of the depletion layer cannot be suppressed by channel stopper layer 80, leakage current will flow via the depletion layer along the surface exposed by dicing of the substrate. Namely, if a high voltage is suddenly applied, generated carriers move toward the front side of the substrate due to crystal defect, and the depletion layer will rapidly extends. The extension of the depletion layer cannot be suppressed, resulting in generation of leakage current.

In semiconductor device 50G1, electrode 41 serving as a channel stopper layer is formed similarly to an interconnect (not shown) connecting other electrodes (through electrodes or the like) to each other, and extension of the depletion layer can surely be suppressed by this electrode 41. Regarding annular electrode 41 of semiconductor device 50G1, electrode 41 is disposed to extend further into n-type buffer layer 82 of a high concentration and thus provides isolation from the surface exposed by dicing of the substrate, so as to prevent leakage current from generating.

Annular electrode 41 can be formed in the same process as an interconnect portion (interconnect portions 40a to 40f in the above-described embodiments each) connecting a plurality of electrodes provided in semiconductor device 50G1. Semiconductor device 50Z1 requires a process for providing channel stopper layer 80. In contrast, for semiconductor device 50G1, electrode 41 can be formed in the same process as the interconnect portions connecting a plurality of electrodes, and therefore, the production efficiency can be improved.

Referring to FIGS. 18 and 19, semiconductor device 50G1 and semiconductor device 50Z1 that are substantially equivalent in terms of breakdown voltage characteristic will be compared with each other. Dimension L1 between conductive film 93 and its closest inner aluminum plate 91b of semiconductor device 50G1 is compared with dimension L2 between conductive film 93 and its closest inner aluminum plate 91b of semiconductor device 50Z1 in FIG. 19. There is a relation of dimension L2≥dimension L1.

In other words, semiconductor device 50G1 in the present embodiment can have a smaller dimension between conductive film 93 and its closest inner aluminum plate 91b. For semiconductor device 50G1 in the present embodiment, the size of the whole semiconductor device including the guard ring can be reduced.

Figure 20:
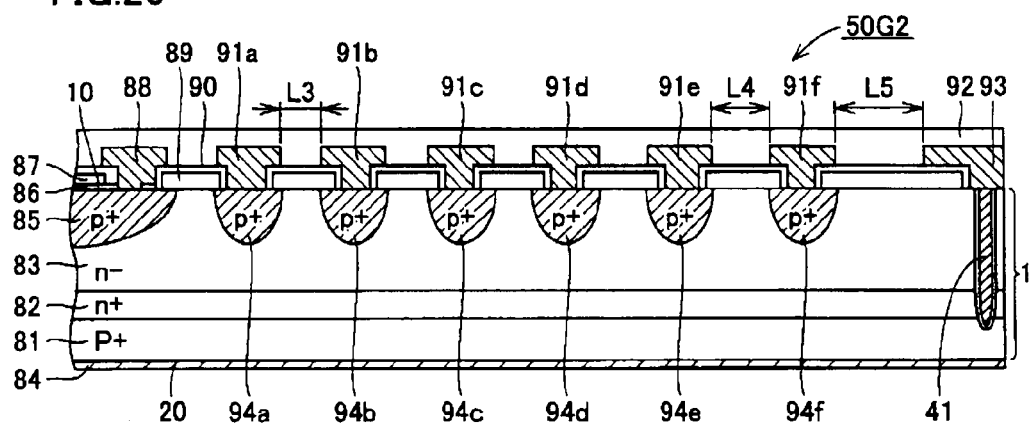
FIG. 20 is a cross section showing an entire configuration of another semiconductor device in the fourth embodiment.

Referring to FIG. 20, another semiconductor device 50G2 in the present embodiment will be described. Semiconductor device 50G2 includes a plurality of guard rings 94a to 94f larger in number than the guard rings of semiconductor device 50G1. Other features of semiconductor device 50G2 are similar to those of semiconductor device 50G1. In this case as well, the function and effect as described above can be achieved by using an annular electrode 41.

The distance between adjacent two of guard rings 94a to 94f is relatively larger in a region closer to the outer periphery than a region relatively further from the outer periphery. Accordingly, the distance between adjacent two of aluminum plates 91a to 91f is also relatively larger in a region closer to the outer periphery than a region relatively further from the outer periphery. For example, dimension L3 between aluminum plates 91a and 91b, and dimension L4 between aluminum plates 91e and 91f have a relation of L3<L4.

As to dimension L5 between aluminum plate 91f and annular conductive film 93 provided on first main surface 10, located outside and separated from aluminum plate 91f by a predetermined distance, there is a relation of L3<L4<L5.

Figure 21:
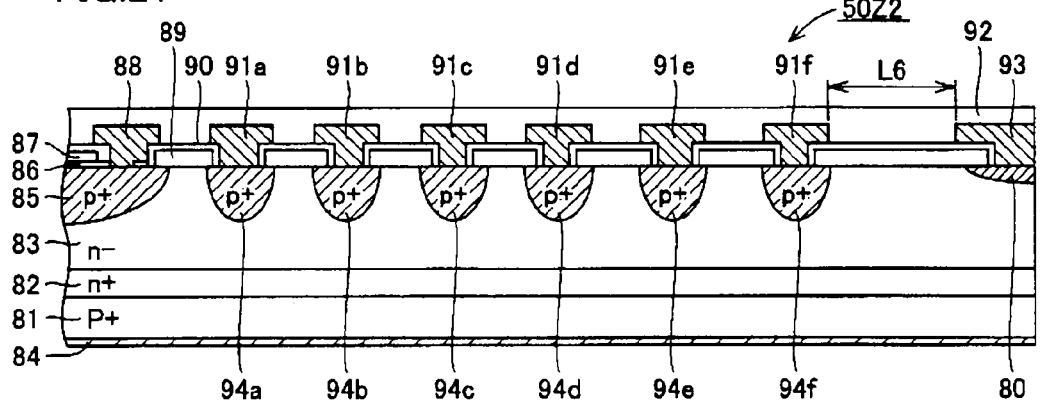
FIG. 21 is a cross section showing a comparative example to be compared with the other semiconductor device in the fourth embodiment shown in FIG. 20.

Referring to FIG. 21, another common semiconductor device 50Z2 and semiconductor device 50G2 that are substantially equivalent in terms of breakdown voltage characteristic will be compared with each other. Dimension L5 between conductive film 93 and closest inner aluminum plate 91f of semiconductor device 50G2, and dimension L6 between conductive film 93 and closest inner aluminum plate 91f of semiconductor device 50Z2 in FIG. 21 are compared, and there is a relation of L6≧L5.

In semiconductor device 50G2, the dimension between conductive film 93 and aluminum plate 91f located immediately inside conductive film 93 can be made relatively smaller. In particular, where the number of guard rings is larger, the dimension between conductive film 93 and its closest inner aluminum plate 91f can be made still smaller. With semiconductor device 50G2, the size of the whole semiconductor device including guard rings can be reduced.

Fifth Embodiment

Manufacturing Method

Referring to FIGS. 22 to 29, a method of manufacturing a semiconductor device 50H in the present embodiment will be described. Semiconductor device 50H produced following the manufacturing method in the present embodiment corresponds to semiconductor device 50C in the above-described second embodiment.

Figure 22:
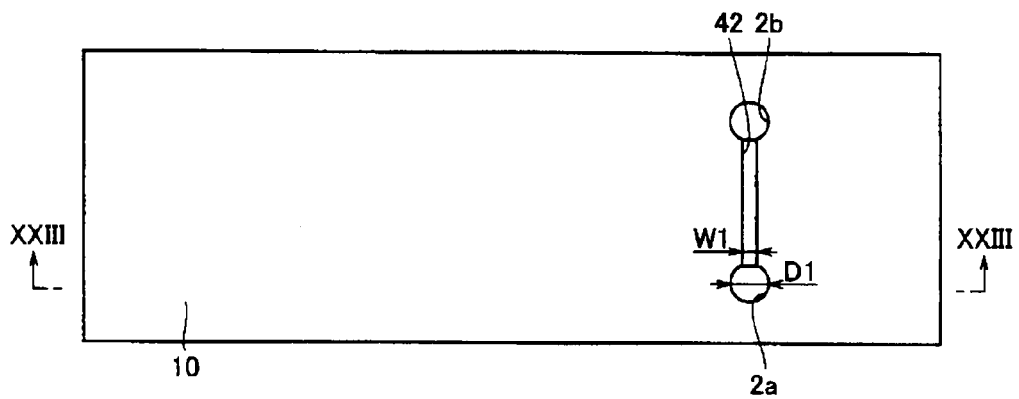
FIG. 22 is a plan view for illustrating a process for manufacturing a semiconductor device in a fifth embodiment.
Figure 23:
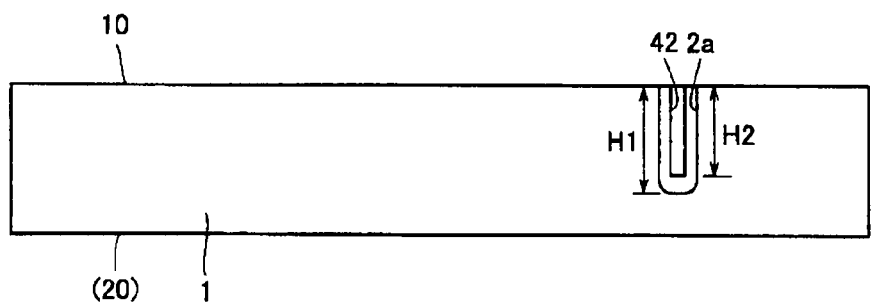
FIG. 23 is a cross section (first cross section) along line XXIII-XXIII in FIG. 22.

Referring to FIGS. 22 and 23, a semiconductor substrate 1 having a first main surface 10 and a second main surface 20 is prepared first. For this semiconductor substrate 1, photolithography is used to form contract holes 2a and 2b extending from first main surface 10 in the depth direction of semiconductor substrate 1. Referring to FIG. 22, while two contact holes 2a and 2b are shown, two or more contact holes separated from each other may be formed as required.

Photolithography is used to form an interconnect trench 42 connecting contact holes 2a and 2b having been formed. Interconnect trench 42 is formed to extend from first main surface 10 in the depth direction of semiconductor substrate 1 without passing through semiconductor substrate 1.

Of contact holes 2a and 2b, contact hole 2a formed to contain an electrode (30a) that is a through electrode as described later is formed so that the shape as seen on first main surface 10 is substantially circular in plan view. In the portion where interconnect trench 42 and contact hole 2a abut on each other, width W1 of interconnect trench 42 coupled to contact hole 2a is smaller than diameter D1 of contact hole 2a.

Because of the loading effect, for contact hole 2a and interconnect trench 42 having been formed, height (depth) H1 of contact hole 2a is larger than height (depth) H2 of interconnect trench 42.

Contact holes 2a, 2b and interconnect trench 42 may preferably be formed simultaneously. Interconnect trench 42 may be formed after contract holes 2a and 2b are formed, or contact holes 2a and 2b may be formed after interconnect trench 42 is formed.

Figure 24:
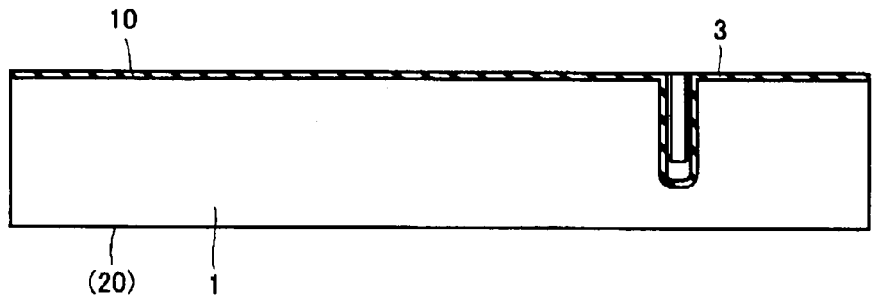
FIGS. 24 to 27 are second to fifth cross sections for illustrating the process for manufacturing the semiconductor device in the fifth embodiment.
Figure 25:
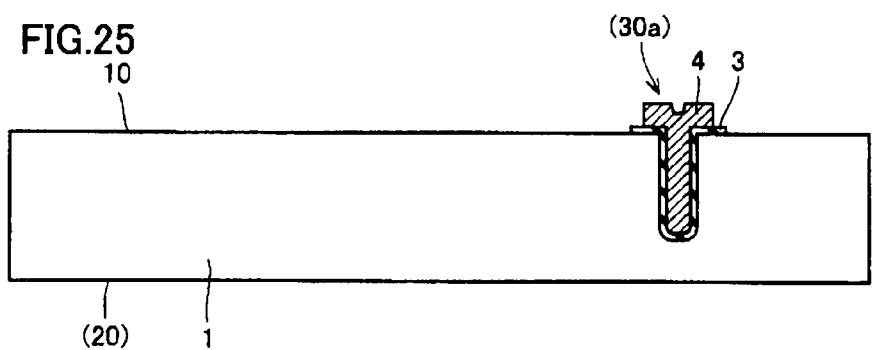

Referring to FIG. 24, after contact holes 2a, 2b and interconnect trench 42 are formed, a first insulating film 3 is formed to cover the surface of contact holes 2a, 2b and interconnect trench 42. Referring to FIG. 25, after first insulating film 3 is formed, a conductive metal 4 is applied to fill the inside of contact holes 2a, 2b and interconnect trench 42 covered with first insulating film 3. After conductive metal 4 is applied to fill the inside, first insulating film 3 is removed except for a portion around metal 4.

Figure 26:
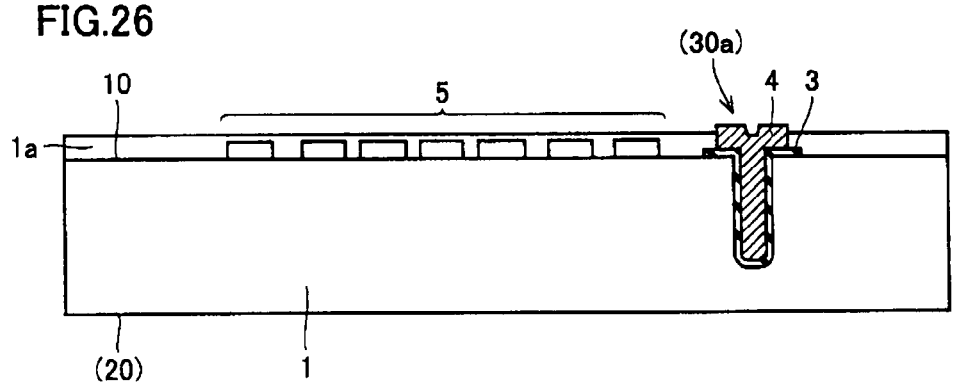

Referring to FIG. 26, after first insulating film 3 is removed, a desired semiconductor element portion 5 is formed at the surface of semiconductor substrate 1. Alternatively, after semiconductor element portion 5 is formed at the surface of semiconductor substrate 1, contact holes 2a, 2b and interconnect trench 42 may be formed and thereafter conductive metal 4 may be applied to fill the inside as described above. After semiconductor element portion 5 is formed, an interlayer insulating film 1a of a predetermined thickness is formed in such a manner that leaves the surface of metal 4 exposed.

Figure 27:
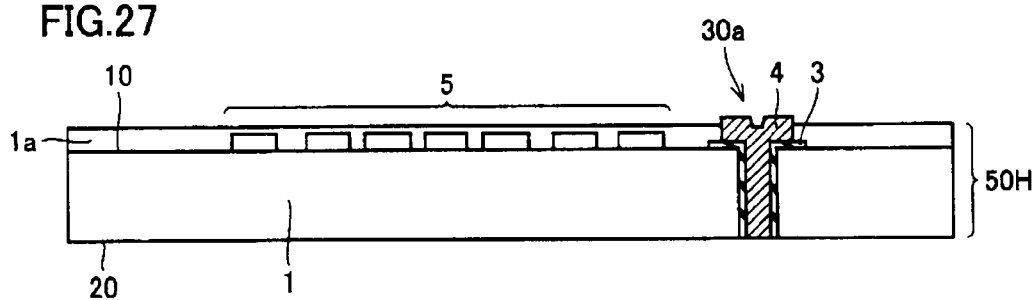

Referring to FIG. 27, after semiconductor element portion 5 is formed, second main surface 20 of semiconductor substrate 1 is polished from the rear side. Until metal 4 is exposed on second main surface 20, second main surface 20 of semiconductor substrate 1 is polished in the direction of the depth. Metal 4 is thus exposed on second main surface 20, and accordingly conductive metal 4 filling the inside of contact hole 2a runs through semiconductor substrate 1 to reach second main surface 20. In this way, electrode 30a that is a through electrode is completed.

Another electrode (30b) (not shown) may also be configured to reach second main surface 20 so that this electrode (30b) forms a through electrode. Alternatively, this electrode (30b) may be configured not to reach second main surface 20. Following the process as described above, semiconductor device 50H in the present embodiment can be produced.

Figure 28:
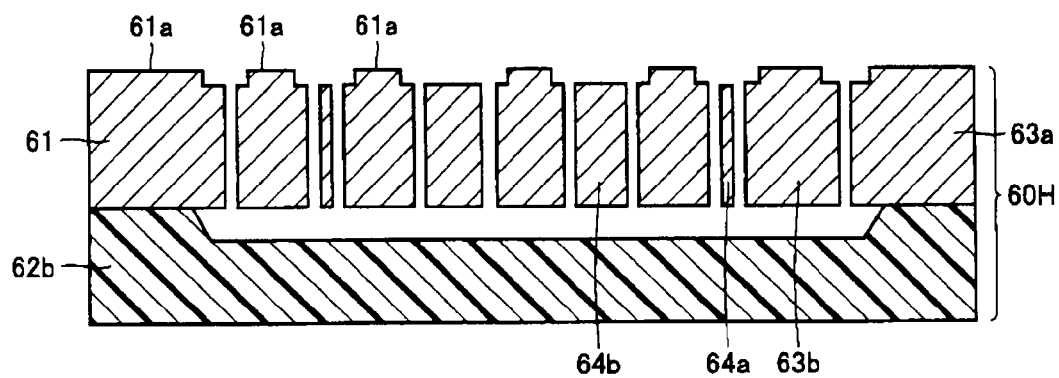
FIG. 28 is a cross section showing another semiconductor device to be connected to the semiconductor device in the fifth embodiment.

Referring to FIG. 28, a description will be given of a semiconductor device 60H to which semiconductor device 50H as produced is to be connected. Semiconductor device 60H is a semiconductor acceleration sensor having a thin-film structure. Semiconductor device 60H used here, like semiconductor device 60C described in connection with the second embodiment, does not have cap portion 62a but instead has only a cap portion 62b, regarding the cap portions described with reference to FIG. 45.

Figure 29:
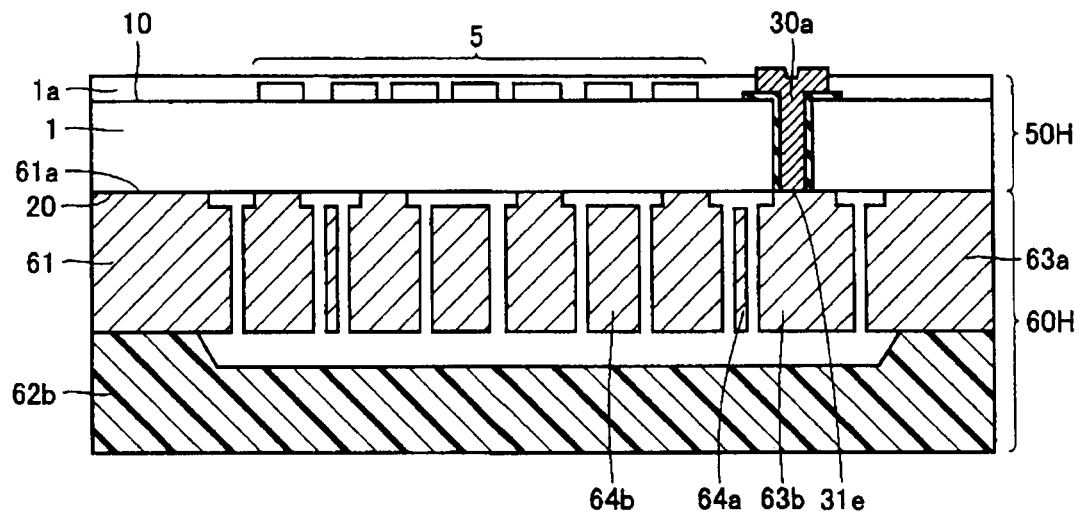
FIG. 29 is a cross section showing a configuration where the semiconductor device and the other semiconductor device in the fifth embodiment are three-dimensionally mounted.

Referring to FIG. 29, a surface 61a of semiconductor device 60H and second main surface 20 of semiconductor device 50H in the present embodiment are joined together in the form of a wafer, so that semiconductor devices 50H and 60H mounted three-dimensionally can be obtained.

Semiconductor device 50H obtained following the manufacturing method in the present embodiment may be configured so that semiconductor device 60H is joined to first main surface 10 of semiconductor device 50H and another semiconductor device (70H) is joined to second main surface 20 of semiconductor device 50H.

A semiconductor device used for a multilayer configuration having further plurality of semiconductor devices stacked together, instead of the double layer configuration as shown in FIG. 29, can also be manufactured. Following the method of manufacturing a semiconductor device in the present embodiment, semiconductor devices may be mounted three-dimensionally by disposing semiconductor device 60H on first main surface 10 of semiconductor device 50H and disposing semiconductor device 70H on second main surface 20. This configuration is similar to the configuration described with reference to FIG. 4 in the first embodiment. At this time, electrode 30a of semiconductor device 50H forms a through electrode and electrodes 30a and 30b are electrically connected to each other by interconnect portion 40a. Semiconductor device 50H is thus used as an interconnect electrode.

In this way, semiconductor devices 50H, 60H and 70H can be electrically connected. When semiconductor devices 50H and 70H are joined together, second main surface 20 of semiconductor device 50H may preferably be covered with an insulating film such as oxide film except for the portion where electrode 30a that is a through electrode is exposed.

Another Configuration of Fifth Embodiment

Figure 30:
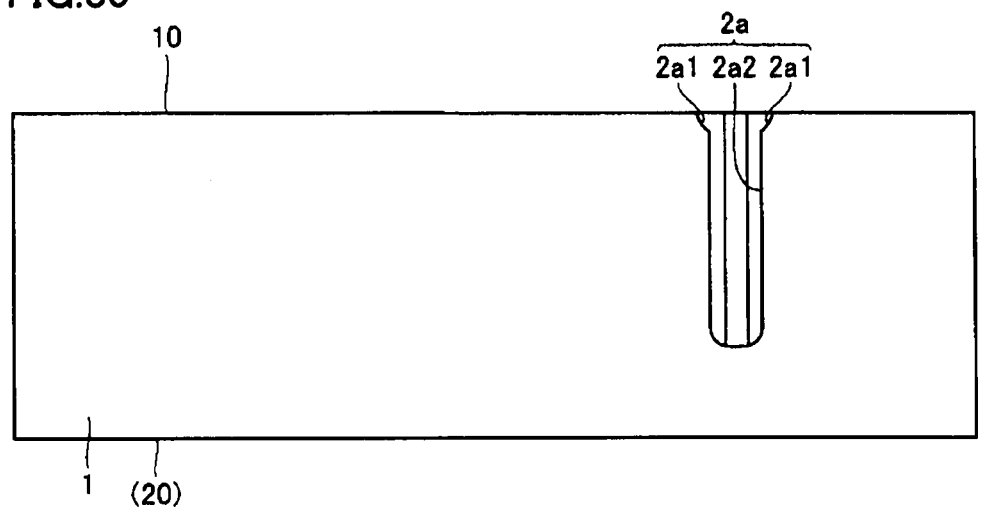
FIG. 30 is a cross section (first cross section) for illustrating another process for manufacturing a semiconductor device in the fifth embodiment, to be compared with FIG. 23.

Referring again to FIG. 23, according to the description above, contact hole 2a is formed in semiconductor substrate 1 to extend from first main surface 10 in the depth direction of semiconductor substrate 1. Referring to FIG. 30, contact hole 2a may include a tapered portion 2a1 formed to have the hole diameter gradually decreasing from first main surface 10 in the direction of depth of semiconductor substrate 1 and have a substantially V-shaped cross section, and a tubular portion 2a2 having substantially the same hole diameter from the lower end of the tapered portion in the depth direction of semiconductor substrate 1.

Tapered portion 2a1 having a substantially V-shaped cross section and tubular portion 2a2 having substantially the same hole diameter from the lower end of tapered portion 2a1 in the depth direction of semiconductor substrate 1 may be formed in the following manner. In the process of forming contact hole 2a, tubular portion 2a2 is formed first by isotropic etching and thereafter tapered portion 2a1 is formed by anisotropic etching.

Since contact hole 2a includes tapered portion 2a1 and tubular portion 2a2, first insulating film 3 covering the inner surface of contact hole 2a can be easily formed. Further, the inside of this insulating film 3 can be easily filled with conductive metal 4.

Figure 31:
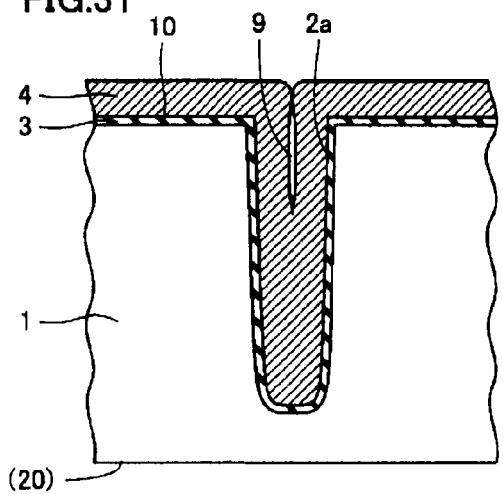
FIG. 31 is a cross section showing a comparative example to be compared with the other process for manufacturing a semiconductor device in the fifth embodiment, to be compared with FIG. 30.

Further, since contact hole 2a includes tapered portion 2a1 and tubular portion 2a2, a gap 9 as shown in FIG. 31 can be prevented from being generated. Gap 9 is more likely to be generated in the case for example where the depth of a contact hole provided in a semiconductor substrate is about 100 µm or more. Gap 9 is a space generated, when the inner surface of the contact hole is covered with an insulating film and a conductive metal is applied to fill the inside of the insulating film, between conductive metal layers in the contact hole.

Specifically, in the process of forming a contact hole of approximately 100 µm or more by etching, the semiconductor substrate surface (first main surface 10) and therearound is exposed to an etching plasma for a long period of time. As a result, the side of the contact hole shows a bowing shape where the side laterally expands in the vicinity of the semiconductor substrate surface. If the contact hole with the bowing shape is covered with an insulating material and then a conductive metal is applied thereto, the layers of the applied metal adhere to each other in the vicinity of the semiconductor substrate surface. Thus, the contact hole with the bowing shape cannot be filled completely with the metal, and gap 9 is generated.

In contrast, contact hole 2a including tapered portion 2a1 and tubular portion 2a2 can be used to prevent gap 9 from being generated when metal is applied to fill contact hole 2a.

Still Another Configuration of Fifth Embodiment

Referring again to FIGS. 24 and 25, according to the above description of the process, contact holes 2a, 2b and interconnect trench 42 are formed, thereafter first insulating film 3 is formed to cover the surface of contact holes 2a, 2b and interconnect trench 42, and then conductive metal 4 is applied to fill the inside of contact holes 2a, 2 and interconnect trench 42 covered with first insulating film 3.

Here, the metal applied to fill the inside of contact holes 2a, 2b and interconnect trench 42 covered with first insulating film 3 may be a doped polysilicon. The doped polysilicon is preferably applied under deposition conditions optimized so that the stress exerted by first insulating film 3 on semiconductor substrate 1 is alleviated.

As described above, there are some cases where the depth of contact holes 2a, 2b and interconnect trench 42 is approximately 100 µm or more. Metal 4 filling the inside of contact holes 2a, 2b and interconnect trench 42 covered with first insulating film 3 exerts stress on semiconductor substrate 1 through contact holes 2a, 2b and interconnect trench 42. In the case where the depth of contact holes 2a, 2b and interconnect trench 42 is approximately 100 µm or more, the influence of the stress acting on semiconductor substrate 1 may not be negligible depending on the case.

The doped polysilicon is electrically conductive and therefore, a process for making the material electrically conductive after applied to fill the holes and trench is unnecessary. Further, in the process for applying the doped polysilicon, various parameters (temperature, concentration, pressure, heat treatment for example) for the doped polysilicon can be controlled to optimize the directional property of the stress acting on first insulating film 3 (compressive stress or tensile stress) and the magnitude of the stress.

Specifically, depending on the stress exerted by first insulating film 3 on semiconductor substrate 1, the stress can be reduced. More specifically, in the case for example where first insulating film 3 exerts compressive stress on semiconductor substrate 1, the doped polysilicon that is a metal to fill the holes and trench may have a tensile property. On the contrary, in the case where first insulating film 3 exerts tensile stress on semiconductor substrate 1, the doped polysilicon that is a metal to fill the holes and trench may have a compressive property. Consequently, the stress exerted on semiconductor substrate 1 by first insulating film 3 and the doped polysilicon that is a metal to fill the holes and trench can be alleviated.

Sixth Embodiment

Manufacturing Method, FIGS. 32-42

Referring to FIGS. 32 to 42, a method of manufacturing a semiconductor device 50J in the present embodiment will be described. The method of manufacturing semiconductor device 50J corresponds to the configuration of semiconductor device 50F shown in FIG. 15. Second main surface 20 of semiconductor device 50J obtained following the manufacturing method in the present embodiment is covered with second insulating film 6 except for the portion where electrode 30a that is a through electrode is provided as shown in FIG. 15. Lower end 34 of electrode 30a is exposed from second insulating film 6.

Figure 32:
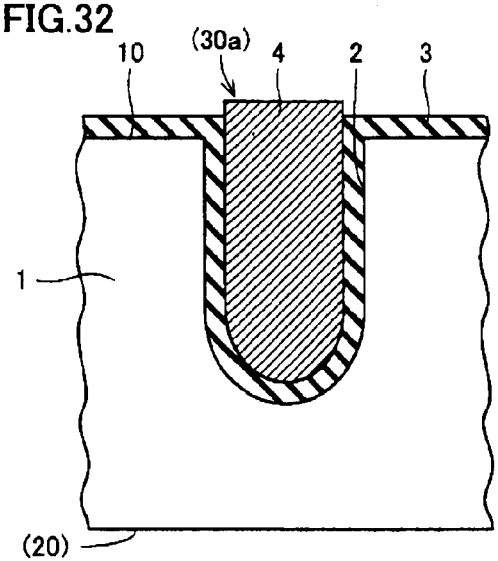
FIGS. 32 to 37 are first to sixth cross sections for illustrating a process for manufacturing a semiconductor device in a sixth embodiment.

Specifically, referring to FIG. 32, semiconductor substrate 1 having first main surface 10 and second main surface 20 is prepared first. For this semiconductor substrate 1, photolithography is used to form contact hole 2 extending from first main surface 10 in the direction of depth of semiconductor substrate 1. Another contact hole (not shown) separated from contact hole 2 is also formed.

In order to connect contact hole 2 and another contact hole having been formed, an interconnect trench (42) (not shown) is formed by photolithography. Interconnect trench 42 is formed to extend from first main surface 10 in the direction of depth of semiconductor substrate 1 without passing through semiconductor substrate 1.

Of the contact holes having been formed, contact hole 2 formed to contain an electrode (30a) that is a through electrode as described later has a substantially circular shape on first main surface 10 as seen in plan view. In the portion where interconnect trench 42 and this contact hole 2 abut on each other, the width of interconnect trench 42 coupled to contact hole 2 is made smaller than the diameter of contact hole 2.

Because of the loading effect, the height (depth) of this contact hole 2 is larger than the height (depth) of interconnect trench 42, when contact hole 2 and the interconnect trench are formed.

Contact hole 2 (including another contact hole (not shown)) and interconnect trench 42 may preferably be formed simultaneously. Alternatively, after contact hole 2 is formed, interconnect trench 42 may be formed, or interconnect trench 42 may be formed and thereafter contact hole 2 may be formed.

After interconnect trench 42 is formed, first insulating film 3 is deposited to cover the surface of contact hole 2, another contact hole and interconnect trench 42. After first insulating film 3 is deposited, conductive metal 4 is applied to fill the inside of contact hole 2, another contact hole and interconnect trench 42 covered with first insulating film 3.

Figure 33:
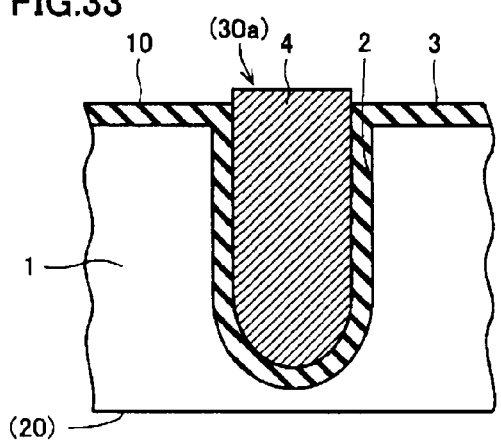
Figure 34:
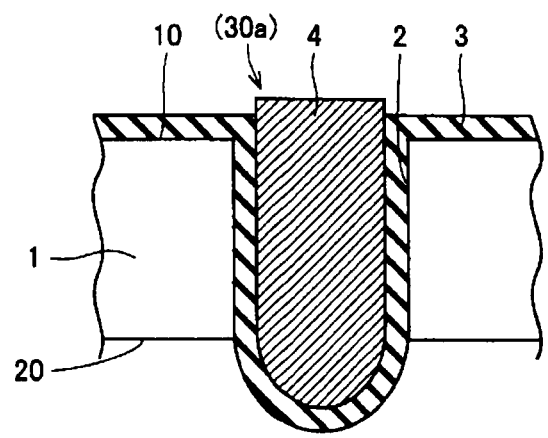

Referring to FIG. 33, after conductive metal 4 is applied to fill the holes and trench, semiconductor substrate 1 is polished from second main surface 20 side so that a predetermined thickness of semiconductor substrate 1 is left under the lower end (end of etching) of contact hole 2. Referring to FIG. 34, semiconductor substrate 1 is etched using a predetermined etchant from second main surface 20 side in the depth direction of semiconductor substrate 1, so that the lower end of first insulating film 3 covering contact hole 2 is exposed from second main surface 20.

Here, first insulating film 3 at this time serves as an etching mask (etching stopper). In the case where second main surface 20 is configured to include main surfaces with a step or level difference as described above (FIG. 12), the thickness of first insulating film 3 and etching conditions can be adjusted to form an electrode adapted to the depth of the stepped main surface.

Figure 35:
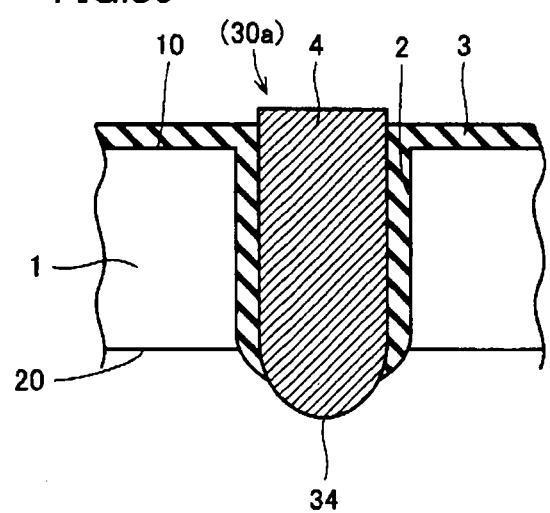
Figure 36:
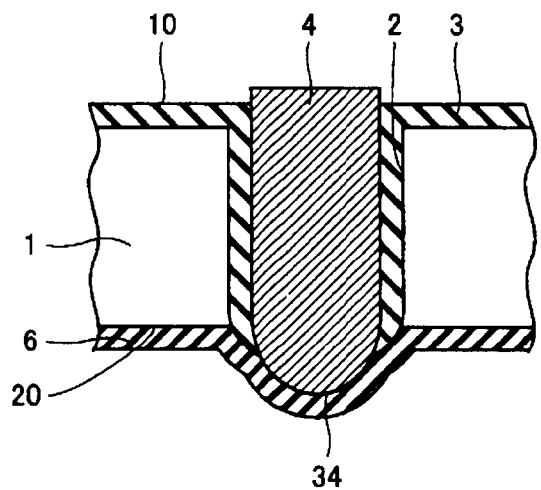

Referring to FIG. 35, first insulating film 3 covering contact hole 2 is selectively etched using a predetermined etchant, so that lower end 34 of applied metal 4 is exposed from first insulating film 3. Selective etching here refers to etching of the lower end of first insulating film 3 and the portion around the lower end of first insulating film 3 where first insulating film 3 and metal 4 overlap as seen from above. Referring to FIG. 36, second insulating film 6 is deposited over the whole of second main surface 20 of semiconductor substrate 1 so as to cover the exposed lower end 34 of metal 4.

Figure 37:
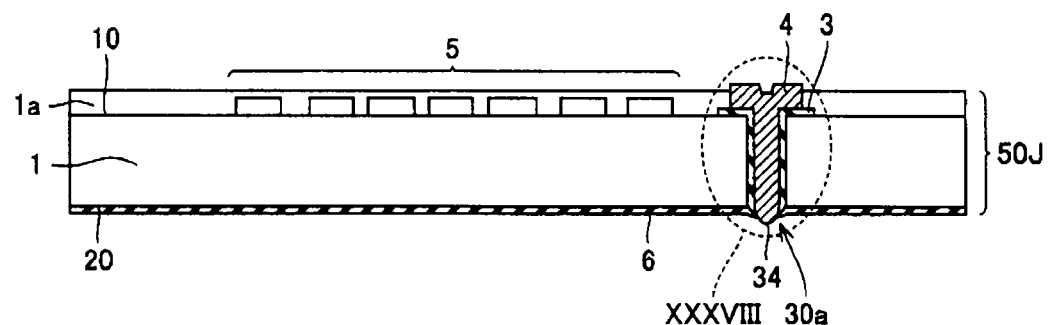
Figure 38:
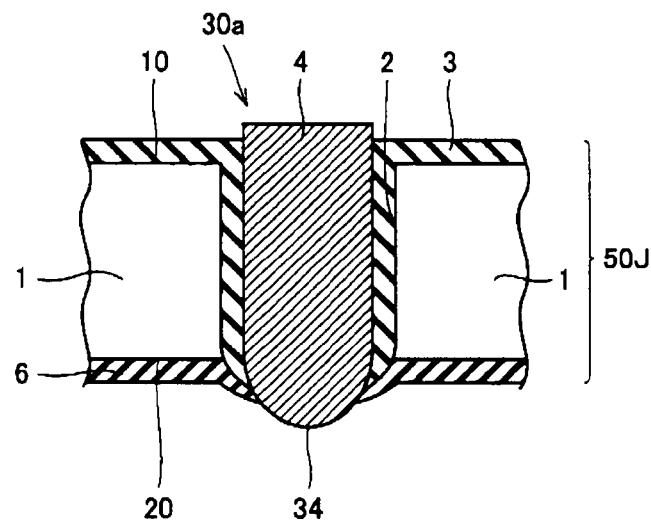
FIG. 38 is a partially enlarged view of a region enclosed by line XXXVIII in FIG. 37.

Referring to FIGS. 37 and 38, after second insulating film 6 is deposited, second insulating film 6 covering lower end 34 of metal 4 is selectively etched with a predetermined etchant so as to expose lower end 34 of metal 4 from second insulating film 6. Selective etching here refers to etching of the lower end of second insulating film 6 and the portion around the lower end of second insulating film 6 where second insulating film 6 and metal overlap as seen from above. In this way, semiconductor device 50J in the present embodiment can be obtained.

A description will be given of a semiconductor device 60J to which semiconductor device 50J as obtained is to be connected.

Figure 39:
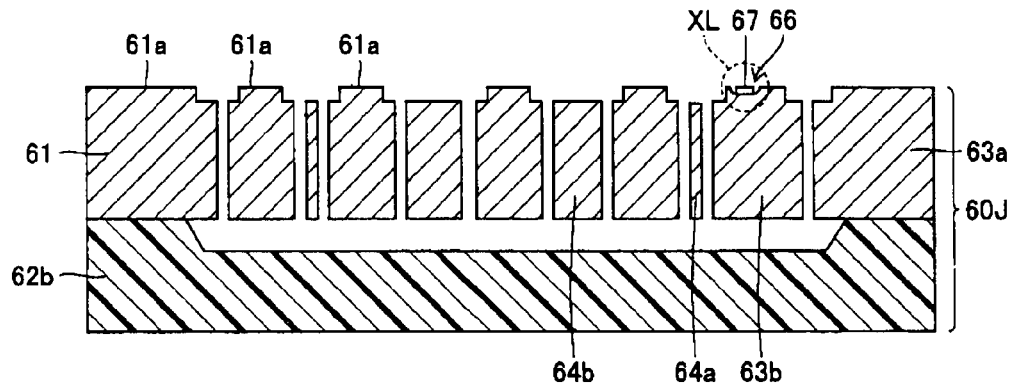
FIG. 39 is a cross section showing another semiconductor device to be connected to the semiconductor device obtained in the sixth embodiment.
Figure 40:
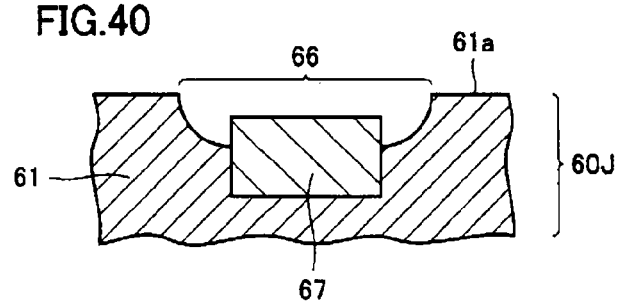
FIG. 40 is a partially enlarged view of a region enclosed by line XL in FIG. 39.

Referring to FIGS. 39 and 40, semiconductor device 60J is for example a semiconductor acceleration sensor having a thin-film structure. As for the cap portion, semiconductor device 60J used here, like the third and fifth embodiments, does not have cap portion 62a but has a cap portion 62b only. For electrical connection with lower end 34 of electrode 30a, semiconductor device 60J includes a connecting portion 66. Connecting portion 66 is formed to recede from a surface 61a of semiconductor device 60J and have a substantially U-shaped cross section. An aluminum (AL) 67 is embedded in the surface of a substantially central portion of connecting portion 66.

Figure 41:
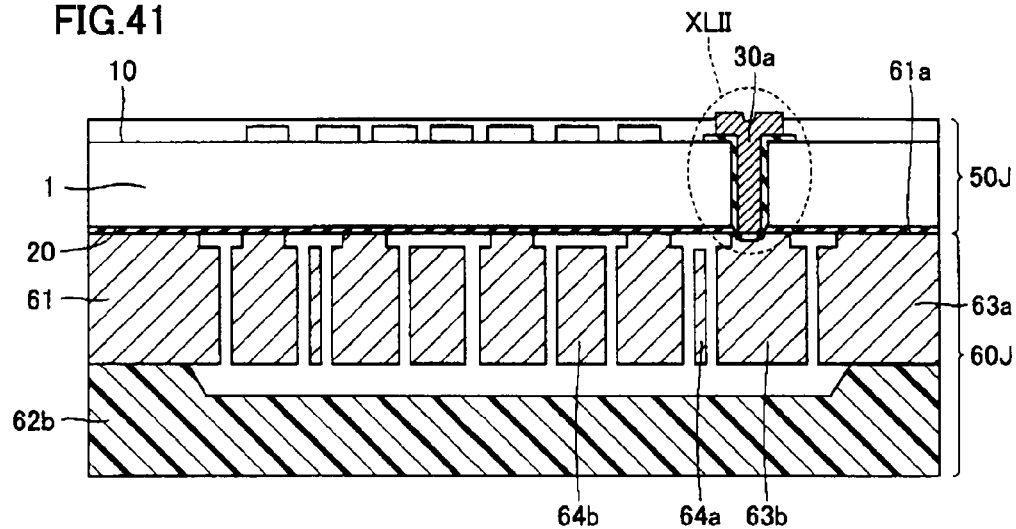
FIG. 41 is a cross section showing a configuration where the semiconductor device and another semiconductor device obtained in the sixth embodiment are three-dimensionally mounted.
Figure 42:
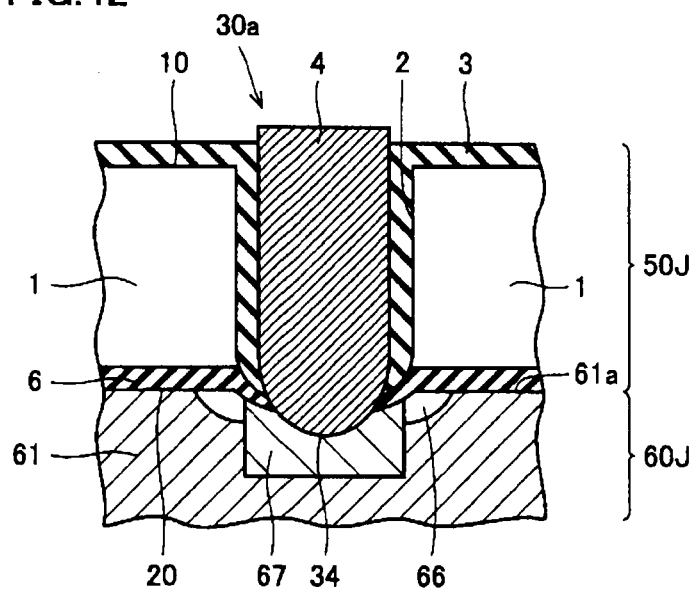
FIG. 42 is a partially enlarged view of the region enclosed by line XLII in FIG. 41.
Figure 43:
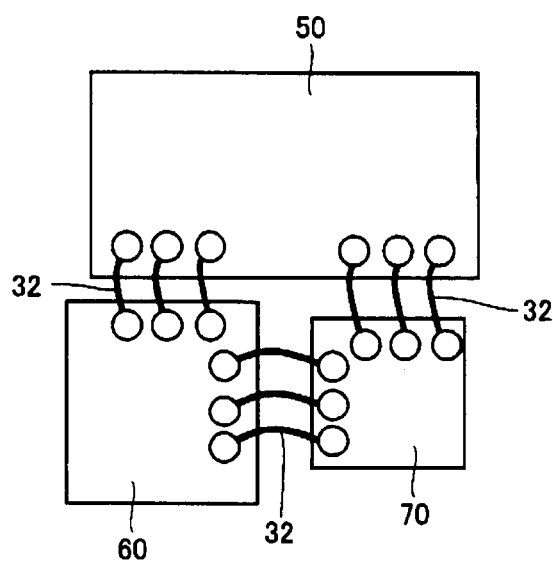
FIG. 43 is a plan view showing three common semiconductor devices as mounted.
Figure 44:
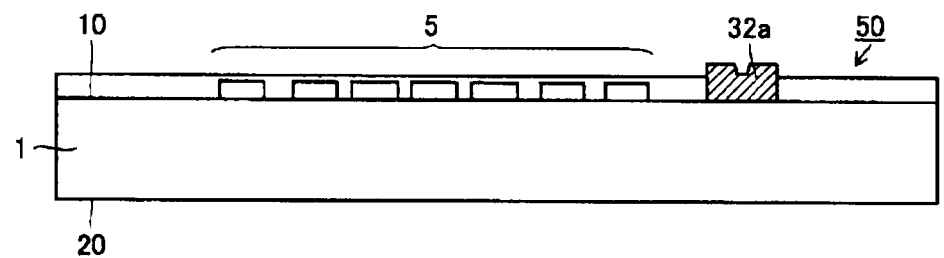
FIG. 44 is a cross section showing a common semiconductor device provided as an integrated circuit.

Referring to FIGS. 41 and 42, surface 61a of semiconductor device 60J and second main surface 20 of semiconductor device 50J in the present embodiment are joined together in the form of a wafer. Thus, the configuration where semiconductor devices 50J and 60J are mounted three-dimensionally can be obtained.

Another Configuration of Sixth Embodiment

Referring again to FIG. 32, according to the description above, contact hole 2 is formed in semiconductor substrate 1 from first main surface 10 in the direction of the depth of semiconductor substrate 1. Like the other configuration of the fifth embodiment (see FIG. 30), contact hole 2 may include a tapered portion formed to have the hole diameter gradually decreasing from first main surface 10 in the depth direction of semiconductor substrate 1 and have a substantially V-shaped cross section, and a tubular portion having substantially the same hole diameter from the lower end of the tapered portion in the depth direction of semiconductor substrate 1.

Since contact hole 2 includes the tapered portion and the tubular portion, first insulating film 3 covering the inner surface of contact hole 2 can be easily deposited. Further, the inside of this insulating film 3 can be easily filled with conductive metal 4. Furthermore, like the other configuration of the fifth embodiment, gap 9 as shown in FIG. 31 can be prevented from being generated.

Still Another Configuration of Sixth Embodiment

Referring again to FIG. 32, according to the description above, contact hole 2 and the interconnect trench (not shown) are formed, thereafter first insulating film 3 is formed to cover the surface of contact hole 2 and the interconnect trench, and then conductive metal 4 is applied to fill the inside of contact holes 2, 2 and the interconnect trench covered with first insulating film 3.

Like still another configuration of the fifth embodiment, the metal applied to fill the inside of contact hole 2 and the interconnect trench covered with first insulating film 3 may be a doped polysilicon. The doped polysilicon may preferably be applied under the deposition conditions optimized so that the stress exerted by first insulating film 3 on semiconductor substrate 1 is alleviated.

The doped polysilicon is electrically conductive and therefore, a process for making the material electrically conductive after applied to fill the holes and trench is unnecessary. Further, in the process for applying the doped polysilicon, various parameters (temperature, concentration, pressure, heat treatment for example) for the doped polysilicon can be controlled to optimize the directional property of the stress acting on first insulating film 3 (compressive stress or tensile stress) and the magnitude of the stress.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a semiconductor substrate having first and second main surfaces;
    a plurality of electrodes separated from each other and extending from said first main surface in depth direction of said semiconductor substrate;
    an interconnect portion coupling any plurality of electrodes of said plurality of electrodes and extending from said first main surface in the depth direction of said semiconductor substrate without passing through said semiconductor substrate, for electrically connecting said any plurality of electrodes to each other, the interconnect portion formed using only one or more straight portions, said interconnection portion directly connecting two of the plurality of electrodes; and
    a first insulating film provided between said plurality of electrodes and said semiconductor substrate and between said interconnect portion and said semiconductor substrate,
    at least one of said electrodes electrically connected by said interconnect portion being a through electrode passing through said semiconductor substrate and reaching said second main surface.

2. The semiconductor device according to claim 1, wherein said through electrode is formed with a substantially circular shape as seen on said first main surface, and
    in a portion where said through electrode and said interconnect portion abut on each other, a width of said interconnect portion coupled to said through electrode is smaller than the diameter of said through electrode.

3. The semiconductor device according to claim 1, wherein a plurality of said through electrodes are provided,
    said second main surface of said semiconductor substrate includes a third main surface and a fourth main surface, and a thickness from said first main surface to said fourth main surface is relatively smaller than a thickness from said first main surface to said third main surface,
    at least one of said plurality of through electrodes extends from said first main surface, passes through said semiconductor substrate and reaches said third main surface, and
    at least another one of said plurality of through electrodes extends from said first main surface, passes through said semiconductor substrate and reaches said fourth main surface.

4. The semiconductor device according to claim 1, wherein a plurality of said through electrodes are provided, and
    said semiconductor device further comprises first and second semiconductor devices arranged on said second main surface and electrically connected to each other by said through electrodes and said interconnect portion.

5. The semiconductor device according to claim 4, wherein said second main surface except for a portion where said plurality of through electrodes are located is covered with a second insulating film, and
    said plurality of through electrodes which are not covered with said second insulating film protrude from said second insulating film.

6. The semiconductor device according to claim 5, wherein said second semiconductor device includes a connecting portion formed at a surface of said second semiconductor device for electrically connecting to said plurality of protruding through electrodes,
    said connecting portion is formed to recede from the surface of said second semiconductor device, and
    aluminum is embedded in a surface of a substantially central portion of said connecting portion.

7. The semiconductor device according to claim 1, further comprising:
    a first semiconductor device disposed on said first main surface; and
    a second semiconductor device disposed on said second main surface, wherein
    said first and second semiconductor devices are electrically connected to each other through said plurality of electrodes and said interconnect portion.

8. The semiconductor device according to claim 1, further comprising:
    a plurality of annular guard rings arranged in a peripheral portion in said semiconductor substrate, extending from said first main surface toward said second main surface to a predetermined depth and separated from each other by a predetermined distance;
    an annular conductive film provided on said first main surface and disposed outside and separated from an outermost one of said guard rings by a predetermined distance; and
    an annular electrode provided along said annular conductive film and extending from said first main surface in the depth direction of said semiconductor substrate to a predetermined depth, and serving as a channel stopper.

9. The semiconductor device according to claim 1, wherein doped polysilicon is used as a material for said plurality of electrodes and said interconnect portion, and
    said doped polysilicon is deposited under a deposition condition optimized so that stress exerted by said first insulating film on said semiconductor substrate is relaxed.

10. The semiconductor device according to claim 1, wherein
    said one or more straight portions consists of exactly one straight portion.

* * * * *